United States Patent
Cheng

(10) Patent No.: US 11,791,828 B1
(45) Date of Patent: Oct. 17, 2023

(54) LC-TANK-BASED PHASE-LOCKED LOOP (LCPLL)

(71) Applicant: Ambarella International LP, Santa Clara, CA (US)

(72) Inventor: Yueh Chun Cheng, Cupertino, CA (US)

(73) Assignee: Ambarella International LP, Santa Clara, CA (US)

( * ) Notice: Subject to any disclaimer, the term of this patent is extended or adjusted under 35 U.S.C. 154(b) by 0 days.

(21) Appl. No.: 17/948,910

(22) Filed: Sep. 20, 2022

(51) Int. Cl.
*H03L 7/089* (2006.01)
*H03L 7/093* (2006.01)
*H03L 7/099* (2006.01)
*H03B 5/12* (2006.01)

(52) U.S. Cl.
CPC ......... *H03L 7/0891* (2013.01); *H03B 5/1228* (2013.01); *H03L 7/093* (2013.01); *H03L 7/0992* (2013.01)

(58) Field of Classification Search
CPC . H03L 7/099; H03L 2207/00; H03L 2207/05; H03L 2207/06
See application file for complete search history.

(56) References Cited

U.S. PATENT DOCUMENTS 8,432,229 B2 * 4/2013 Dong ................... H03L 7/0891
331/177 V

* cited by examiner

*Primary Examiner* — Diana J. Cheng
(74) *Attorney, Agent, or Firm* — Christopher P. Maiorana, PC

(57) ABSTRACT

An apparatus comprises a cross-coupled differential amplifier, an inductive-capacitive (LC) tank circuit, and a low-noise voltage supply. The inductive-capacitive (LC) tank circuit is generally coupled in a feedback path of the cross-coupled differential amplifier. The LC tank circuit generally comprises (i) an inductance provided by an inductor, (ii) a first capacitance provided by a parallel coupled varactor circuit, (iii) a second capacitance provided by a parallel coupled first switched-capacitor bank, and (iv) a third capacitance provided by a parallel coupled second switched-capacitor bank. The low-noise voltage supply may be configured to provide a supply voltage of the cross-coupled differential amplifier. The parallel coupled varactor circuit comprises a pair of thick oxide varactors connected with a reverse varactor connection. The parallel coupled first switched-capacitor bank and the parallel coupled second switched-capacitor bank comprise thin oxide switches.

20 Claims, 22 Drawing Sheets

US 11,791,828 B1

LC-TANK-BASED PHASE-LOCKED LOOP (LCPLL)

FIELD OF THE INVENTION

The invention relates to phase-locked loop circuits generally and, more particularly, to a method and/or apparatus for implementing an LC-tank-based phase-locked loop (LCPLL).

BACKGROUND

Phase-locked loops (PLLs) are important building blocks for communication systems. In many applications, inductive-capacitive (LC) tank-based PLLs (LCPLLs) are implemented in order to cover desired operating frequency bands and to accommodate process, voltage, and temperature (PVT) variations. Desired operating frequencies of the LCPLLs are increasing and supply voltages are scaling down with advanced complementary metal-oxide-semiconductor (CMOS) technologies (e.g., supply voltage in Samsung 4 nm process is 1.2V). As the operating frequencies of the LCPLLs increase and the supply voltages scale down, using a tuning gain (e.g., $K_{VCO}$, expressed in MHz/V) of an LC tank-based voltage-controlled oscillator (LCVCO) in an LCPLL to cover temperature variation is more difficult with the lower supply voltages. It is also more difficult to have an LCVCO with high enough Q value (Quality Factor) to start up at high frequency and have good phase noise.

It would be desirable to implement an LC tank-based phase-locked loop (LCPLL).

SUMMARY

The invention concerns an apparatus comprising a cross-coupled differential amplifier, an inductive-capacitive (LC) tank circuit, and a low-noise voltage supply. The inductive-capacitive (LC) tank circuit is generally coupled in a feedback path of the cross-coupled differential amplifier. The LC tank circuit generally comprises (i) an inductance provided by an inductor, (ii) a first capacitance provided by a parallel coupled varactor circuit, (iii) a second capacitance provided by a parallel coupled first switched-capacitor bank, and (iv) a third capacitance provided by a parallel coupled second switched-capacitor bank. The low-noise voltage supply may be configured to provide a supply voltage of the cross-coupled differential amplifier. The parallel coupled varactor circuit comprises a pair of thick oxide varactors connected with a reverse varactor connection. The parallel coupled first switched-capacitor bank and the parallel coupled second switched-capacitor bank comprise thin oxide switches.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
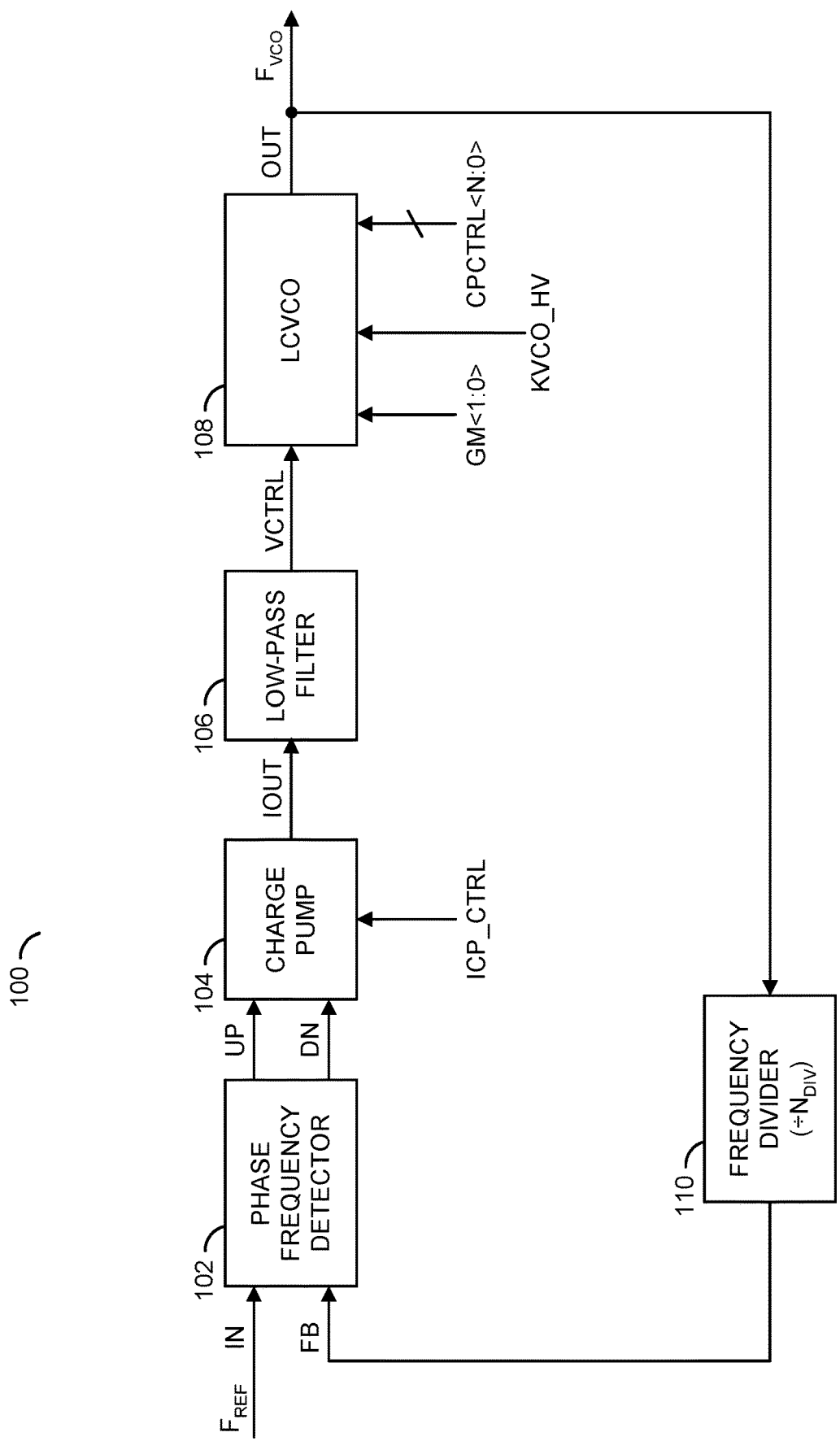
FIG. 1 is a diagram illustrating an inductive-capacitive (LC) phase-locked loop (PLL) circuit in accordance with an embodiment of the invention.

Embodiments of the present invention include providing a LC-tank-based phase-locked loop (LCPLL) that may (i) utilize lower metal layers only in short connections for high speed, (ii) utilize upper metal layers for low resistance and long routings for high speed, (iii) utilize upper metal layers and minimum area with minimum width and length for unit vertical natural capacitors (vncaps) of capacitor banks to maximize Q, (iv) allow connections between gate/drain terminals and metal capacitors to be in orthogonal direction to reduce metal resistance, (v) reduce signal coupling by using a source-drain-drain-source (SDDS) routing technique instead of source-drain-source-drain (SDSD) routing, (vi) overlap multiple metal layers to minimize metal resistance, (vii) use wider even number metal layers for horizontal connection and wider odd number metal layers for vertical connections between two vncaps to reduce metal resistance, (viii) use thick oxide varactor and reverse varactor connection to have wider frequency range (larger Kvco), (ix) use thin oxide switches for capacitor banks to reduce switch resistance and have better Q (internal supply 0.8V), (x) use a low drop out (LDO) regulator to provide a low-noise power supply for amplifier and switch circuits, enabling high transconductance, low switch resistance, and good supply rejection, (xi) utilize novel capacitor bank layout method to have better Q in 4 nm process, (xii) utilize novel metal-oxide-semiconductor (MOS) and varactor layout method to reduce gate resistance and achieve less coupling, (xiii) swap up and down currents in a charge pump for negative VCO gain (−Kvco), and/or (xiv) be implemented as one or more integrated circuits.

In various embodiments, an LC tank-based voltage-controlled oscillator (LCVCO) design in accordance with an embodiment of the invention may be divided between a high voltage (e.g., 1.2V) power domain and a low voltage (e.g., 0.8V) power domain. In an example, the LCVCO design in accordance with an embodiment of the invention may implement a varactor circuit in the high voltage power domain and an transconductance (gm) amplifier core, an inductor, and a number of capacitor banks in the low-voltage power domain. In various embodiments, an LCVCO design in accordance with an embodiment of the invention may utilize thick oxide varactors and reverse varactor connections to provide a wider frequency range and a larger VCO tuning gain (Kvco). Thin oxide switches may be used for capacitor banks to reduce switch resistance and achieve a better Q-factor. A low drop out (LDO) regulator may be used to provide the low voltage supply of the transconductance amplifier core and the switches, resulting in high transconductance, low switch resistance, and good supply rejection.

In various embodiments, the LCVCO design in accordance with an embodiment of the invention may be implemented in a process technology providing a plurality of metal layers. In an example, a process technology providing fifteen metal layers and thirteen via layers may be utilized. In an example, an LCVCO in accordance with an embodiment of the invention may be implemented with Samsung 4 nm process technology. Capacitors may be implemented having minimum area and using higher metal layers (e.g., metal layers 10-12, D10-D12 in Samsung 4 nm process technology), resulting in low metal resistance and high Q. A novel capacitor bank layout method may also be used to provide better Q in 4 nm process technology. A novel metal-oxide-semiconductor (MOS) and varactor layout method may be employed to reduce gate resistance and achieve less coupling. In an example, MOS device terminals may be coupled using a source-drain-drain-source (SDDS) routing technique instead of source-drain-source-drain (SDSD) routing. In the SDDS routing scheme, two metal layers in which drain connections are implemented are located adjacent and between two metal layers in which the source couplings are implemented. When SDSD routing is used, metal coupling at the drain from the source may be three-fold (3×). In contrast, with the SDDS routing scheme, metal coupling at the drain from the source is reduced to two-fold (2×). The SDDS routing scheme may reduce signal coupling parasitic loading. In an example, when four metal layers overlap, loading may be reduced four-fold (4×). In phased-locked loops (PLLs) utilizing an LCVCO design in accordance with an embodiment of the invention, up and down currents in a charge pump may be swapped for a negative tuning gain ($-K_{VCO}$).

In an example, the new LCVCO layout technique shortens the routing of the VCO outputs and lowers the parasitic inductance and resistance of the VCO routing, which avoids reduction of the quality factor (Q) of the LC tank due to long routing. When implementing the LCVCO, the new layout technique generally includes (i) using lower metal layers (e.g., metal layers 1-5) only in short connections for high speed circuits, (ii) using metal layer 6 and above on critical low resistance and long routings for high speed circuits, and (iii) implementing capacitor banks using higher metal layers (e.g., metal layers 10-12) and having minimum area with minimum width and length as unit capacitor to maximize Q. Gate/drain metal connections of transistors in the transconductance (gm) amplifier core and the varactors may be orthogonal to reduce metal resistance. Coupling between two signals may be reduced in half by implemented source-drain-drain-source (SDDS) routing instead of the conventional source-drain-source-drain (SDSD) routing. Metal may be overlapped as much as possible to minimize metal resistance. In an example, wider, even number metal layers may be used to connect horizontally and wider, odd number metal layers may be used to connect vertically between two vertical natural capacitors (VNCAPs) to reduce metal resistance.

Referring to FIG. 1, a diagram is shown illustrating an inductive-capacitive (LC) phase-locked loop (PLL) circuit in accordance with an embodiment of the invention. In an example, a circuit 100 may implement an inductive-capacitive phase-locked loop (LCPLL) circuit in accordance with an embodiment of the invention. In an example, the circuit 100 may be utilized to implement a frequency synthesizer (or generator) circuit of an integrated circuit (IC) or system on chip (SoC). In an example, the circuit 100 may have an input that may receive an input signal (e.g., IN), and an output that may present an output signal (e.g., OUT). In an example, the input signal IN may comprise a first (or reference) frequency (e.g., $F_{REF}$) and the output signal OUT may comprise a second (or VCO) frequency (e.g., $F_{VCO}$).

In an example, the reference frequency may be derived from a precision frequency source such as a crystal (XTAL) oscillator. In an example, the crystal oscillator may be external to an IC or SoC embodying the circuit 100. In an example, a clock signal from the crystal oscillator may be applied to a pin of the IC or SoC and communicated to the input of the circuit 100. In another example, the clock signal from the crystal oscillator may be presented to an input of a pre-scaler circuit (not shown). The pre-scaler circuit may be configured to divide a frequency of the crystal (or external) oscillator to a desired input frequency $F_{REF}$ of the circuit 100. In an example, the pre-scaler circuit may be programmable to allow operation of the circuit 100 with a variety of source clock frequencies.

In an example, the circuit 100 may be configured to generate the frequency $F_{VCO}$ of the output signal OUT as a multiple (e.g., either integer or fraction) of the frequency $F_{REF}$ of the input signal IN (e.g., $F_{VCO}=N \times F_{REF}$). In various embodiments, the frequency and/or phase of the output signal OUT may be locked to the frequency and/or phase of the input signal IN. In an example, one or more clock signals of the IC or SoC embodying the circuit 100 may be derived from the signal OUT. In an example, the signal OUT may be presented to an input of a post-scaler circuit (not shown). The post-scaler circuit may be configured to generate the one or more clock signals by dividing the frequency $F_{VCO}$ of the signal OUT to obtain respective clock frequencies of the one or more clock signals. In an example, the post-scaler circuit may be programmable to allow operation of the circuit 100 in a variety of applications.

In an example, the circuit 100 may comprise a block (or circuit) 102, a block (or circuit) 104, a block (or circuit) 106, a block (or circuit) 108, a block (or circuit) 110. In an example, the block 102 may be implemented as a phase frequency detector (PFD) circuit. The block 104 may be implemented as a charge pump (CP) circuit. The block 106 may be implemented as a loop filter. In an example, the block 106 may be implemented as a low-pass filter. The block 108 may be implemented as an inductive-capacitive voltage-controlled oscillator (LCVCO). The block 110 may be implemented as a frequency divider. In an example, the block 110 may be implemented as an integer-N architecture divider. In another example, the block 110 may be implemented as a fractional-N architecture divider. The blocks 102, 106, and 110 may be implemented using conventional techniques.

In an example, the block 102 is illustrated implementing a phase frequency detector (PFD). The PFD 102 may have a first input that may receive the signal IN, a second input that may receive a signal FB, a first output that may present a signal UP, and a second output that may present a signal DN. The signals UP and DN may implement control signals. The signal FB may be a divided version of the signal OUT. The signal UP, when asserted, may indicate the frequency $F_{VCO}$ of the signal OUT needs to be increased. The signal DN, when asserted, may indicate the frequency $F_{VCO}$ of the signal OUT needs to be decreased. In an example, the PFD 102 may implement an edge sensitive circuit that measures an arrival time of an edge of the signal IN relative to an arrival time of an edge of the signal FB.

In an example, the signal UP may be asserted (e.g., a digital HIGH, or 1) when the edge of the signal IN arrives before the edge of the signal FB. Likewise, the signal DN may be asserted (e.g., a digital HIGH, or 1) when the edge of the signal FB arrives before the edge of the signal IN. In an example, the PFD 102 is generally sensitive to not only a phase difference, but also a frequency difference. When the signal FB is faster than the signal IN (e.g., a frequency $F_{FB}$ of the signal FB is higher than the frequency $F_{REF}$ of the signal IN), edges of the signal FB always arrive earlier than edges of the signal IN, and the signal DN may be asserted to request a decrease in the frequency $F_{VCO}$ of the signal OUT. This functionality generally allows the PFD 102 to function as a frequency detector.

The charge pump 104 is generally driven (controlled) by the PFD 102. In an example, the charge pump 104 may have a first input that may receive the signal UP, a second input that may receive the signal DN, and a third input that may receive a signal (e.g., ICP_CTRL). The signals UP and DN may be used to control the charge pump 104 when the charge pump 104 is enabled. The signal ICP_CTRL may be used to set a reference current of the charge pump 104. In various embodiments, the signal ICP_CTRL may be implemented as a multi-bit digital control signal (e.g., ICP_CTRL<N:0>). In an example, the signal ICP_CTRL my be implemented as a 4-bit digital control signal (e.g., ICP_CTRL<3:0>). However, other numbers of bits may be implemented to meet design criteria of a particular implementation.

In an example, the charge pump 104 may comprise a first current source controlled by the signal UP and a second current source controlled by the signal DN. An output of the charge pump 104 may be coupled to an input of the loop filter 106. In various embodiments, up and down currents of the charge pump 104 may be swapped to provide for a negative tuning gain (e.g., $-K_{VCO}$). In an example, the first current source may be configured to remove (sink) current from an integrating capacitor of the loop filter 106 in response to the signal UP and the second current source may be configured to dump charge into the integrating capacitor of the loop filter 106 in response to the signal DN.

The loop filter 106 may have an output that may present a signal (e.g., VCTRL) comprising a voltage level related to a charge level of an integrating capacitor. If neither the signal UP nor the signal DN is asserted, the output of the charge pump 104 neither dumps charge into nor removes charge from the integrating capacitor of the loop filter 106, which generally happens in steady state. However, any leakage or mismatch between the up/down currents may cause ripples on the output and, therefore, reference spurs to be generated.

In an example, the loop filter 106 may be implemented as a low pass filter. The loop filter 106 is generally configured to reduce ripples on the output of the charge pump 104 and, therefore, reduce reference spurs that may be generated. The loop filter 106 may have an output that may present the signal VCTRL. The signal VCTRL may implement a control voltage signal. In an example (e.g., an operating mode), the loop filter 106 may generate the signal VCTRL in response to a signal (e.g., IOUT) received from the charge pump 104. In another example (e.g., a calibration mode), the loop filter 106 may generate the signal VCTRL in response to a reference voltage signal (e.g., VREF). In an example, the reference voltage VREF may be half of a supply voltage of the LCPLL 100. In an example, a calibration technique similar to one described in U.S. application Ser. No. 17/683,613, filed Mar. 1, 2022, which is herein incorporated by reference in its entirety, may be utilized.

The inductive-capacitive voltage-controlled oscillator (LCVCO) 108 may have a first input that may receive the signal VCTRL, a second input that may receive a signal (e.g., CPCTRL), a third input that may receive a signal (e.g., KVCO_HV), a fourth input that may receive a signal (e.g., GM), and an output that may present the signal OUT. In various embodiments, the signal CPCTRL may be implemented as a multi-bit digital control signal (e.g., CPCTRL<N:0>). In an example, the signal CPCTRL my be implemented as a 7-bit digital control signal (e.g., CPCTRL<6:0>). In various embodiments, the signal GM may be implemented as a multi-bit digital control signal (e.g., GM<K:0>). In an example, the signal GM my be implemented as a 2-bit digital control signal (e.g., GM<1:0>). In various embodiments, the signal KVCO_HV may be implemented as a single bit digital control signal. However, other numbers of bits may be implemented to meet design criteria of a particular implementation. In an example, the number of bits may be selected to ensure a sufficient number of overlapped tuning sub-bands to enable a voltage range of the signal VCTRL to compensate for frequency variation due to temperature variation. The LCVCO 108 is generally configured to generate the signal OUT in response to the signal VCTRL, the signal CPCTRL, the signal KVCO_HV, the signal GM, and a supply voltage VDD. In various embodiments, the supply voltage VDD may be implemented as an analog supply voltage (e.g., AVDD).

In an example, by changing the value of the signal CPCTRL<6:0>, different overlapped tuning sub-bands may be selected for the range of frequency values controlled by the control voltage VCTRL. In an example, a calibration process may be performed to select the value of the signal CPCTRL<6:0> that provides a desired frequency with a value of the control voltage VCTRL near half of the supply voltage VDD when the LCPLL 100 is locked. In an example, the calibration process may determine an optimum tuning sub-band under which the LCPLL 100 may acquire lock with the control voltage VCTRL at approximately half of the supply voltage VDD. During a calibration mode, the LCPLL 100 may be opened at the loop filter 106 and the control voltage VCTRL set to a reference voltage (e.g., approximately half of the supply voltage VDD). The calibration process may be performed by comparing the VCO frequency with a reference signal to determine which signal frequency is higher or lower. Depending on a result of the comparison, another tuning sub-band may be selected by changing the value of the signal CPCTRL<6:0> and the calibration process repeated until predetermined calibration criteria are met. When the predetermined calibration criteria are met, the calibration process may save the value of the signal CPCTRL<6:0> and the calibration mode may be terminated. In an example, a binary search technique may be used in the calibration process.

The block 110 may be implemented as a frequency divider. The block 110 may have an input that may receive the signal OUT and an output that may present the signal FB. In an example, the block 110 may be configured with a divider value (e.g. $N_{DIV}$) corresponding to a desired difference between the frequency $F_{REF}$ of the signal IN and the frequency $F_{VCO}$ of the signal OUT (e.g., $F_{VCO}=F_{REF}*N_{DIV}$). In an example, the block 110 may be programmable to allow operation of the circuit 100 in a variety of applications. In an example, an operating frequency of a communication device may be about 12 GHz. In an example where the signal IN has a frequency of about 24 MHz, the block 110 may be configured with the divider value $N_{DIV}$ having a value of about 500.

In an example, the PFD 102, the charge pump 104, the loop filter 106, and the LCVCO 108 are generally implemented in a first power supply domain having the analog supply voltage AVDD and the block 110 may be implemented in a second power supply domain having a digital supply voltage (e.g., DVDD). In various embodiments, the analog supply voltage AVDD and the digital supply voltage DVDD may be different. In an example, the analog supply voltage AVDD may be implemented as 1.2 Volts. In an example, the digital supply voltage DVDD may be implemented as 0.75 Volts. In embodiments where the analog supply voltage AVDD and the digital supply voltage DVDD are different, the PFD 102 may be configured to level shift the signals IN and FB to the level of the analog supply voltage AVDD.

Figure 2:
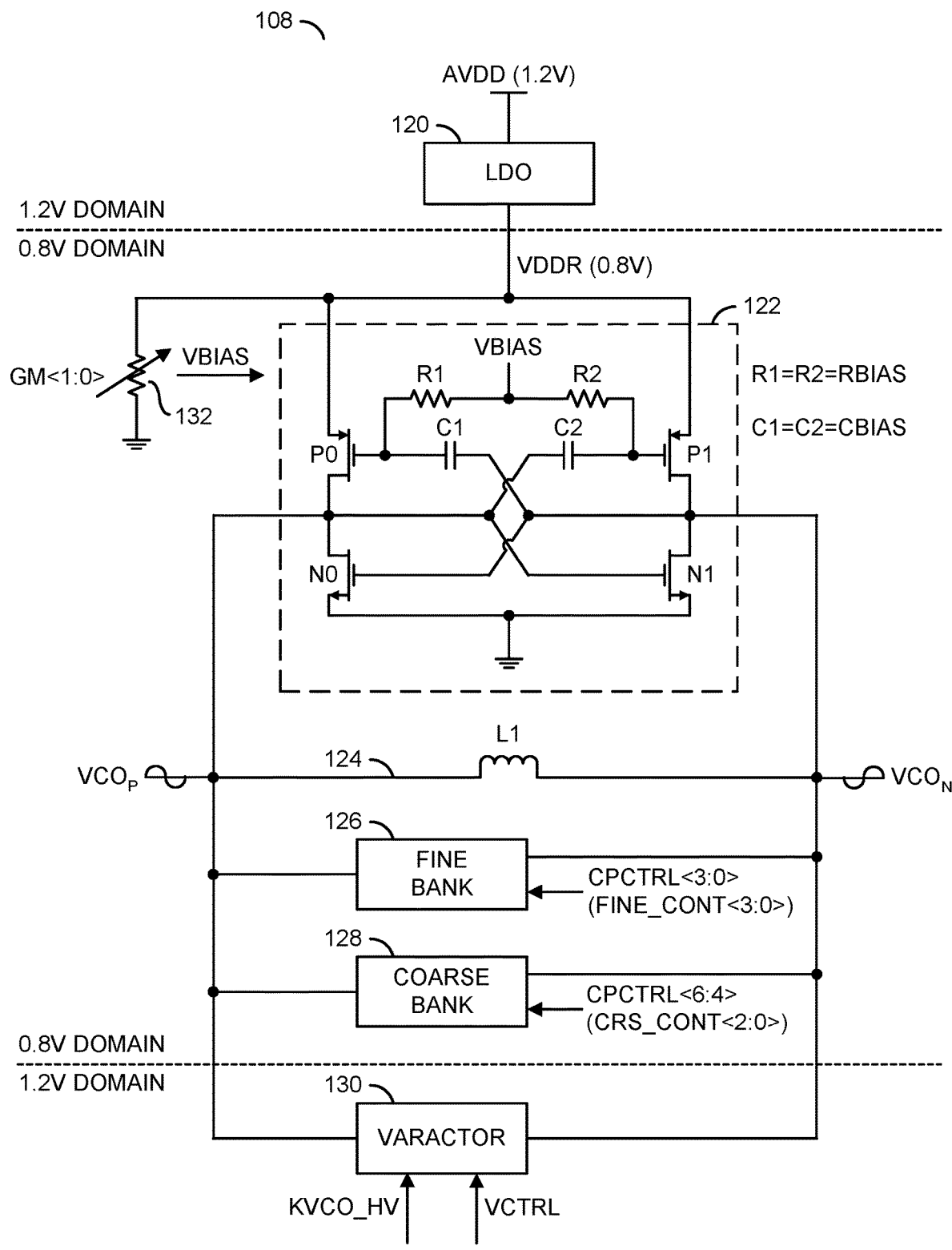
FIG. 2 is a diagram illustrating an inductive-capacitive (LC) voltage-controlled oscillator (VCO) circuit in accordance with an embodiment of the invention.

Referring to FIG. 2, a diagram is shown illustrating an exemplary circuit implementation of the inductive-capacitive voltage-controlled oscillator (LCVCO) 108 in accordance with an embodiment of the invention. In various embodiments, the LCVCO 108 may be implemented as a complimentary cross-coupled VCO architecture. In an example, the LCVCO 108 comprises a block (or circuit) 120, a block (or circuit) 122, a block (or circuit) 124, a block (or circuit) 126, a block (or circuit) 128, a block (or circuit) 130, and a block (or circuit) 132. The circuit 120 may be implemented a low-noise voltage supply. In an example, the circuit 120 may comprise a low drop out (LDO) regulator.

In an example, the circuit 120 may have an input that may receive the analog supply voltage AVDD and an output that present a regulated supply voltage (e.g., VDDR). In an example, the regulated supply voltage VDDR may be implemented as approximately 0.8 Volts.

In an example, the LCVCO 108 may implement a first (external) power domain powered by the analog supply voltage AVDD and a second (internal) power domain powered by the regulated supply voltage VDDR. In an example, the first power domain may be implemented as a high voltage (e.g., 1.2V) power domain and the second power domain may be implemented as a low voltage (e.g., 0.8V) power domain. In an example, the circuit 120 and the circuit 130 may be implemented in the first power domain and the circuit 122, the circuit 124, the circuit 126, the circuit 128, and the circuit 132 may be implemented in the second power domain.

The circuit 122 may be implemented as a cross-coupled differential transconductance (gm) amplifier. The circuit 124 may be implemented as an inductor (with exemplary inductive value L1). In an example, the circuit 124 may be implemented as a spiral integrated circuit inductor. In an example, the circuit 124 may be implemented with an exemplary inductance value of about 237.9 pH. The circuit 126 may be implemented as a fine-tuning switched-capacitor bank. The circuit 128 may be implemented as a coarse-tuning switched-capacitor bank. The circuit 130 may be implemented as a varactor circuit. In an example, the circuit 130 may be implemented as a reverse-connected varactor circuit. The circuit 132 generally implements a bias circuit configured to generate a bias voltage (e.g., VBIAS), which may be used to provide bias for the cross-coupled differential transconductance circuit 122.

An LC tank may be implemented in a feedback path of the cross-coupled differential transconductance amplifier 122. The LC tank is generally composed of an inductance provided by the circuit (inductor) 124 and a capacitance provided by the fine-tuning switched-capacitor bank 126, the coarse-tuning switched-capacitor bank 128, and the varactor circuit 130, which are parallel coupled between a first output (e.g., $VCO_P$) and a second output (e.g., $VCO_N$) of the LCVCO 108. The bias circuit 132 may be coupled between an output of the low-noise voltage supply 120 and a circuit ground potential. The bias circuit 132 may be configured to generate a bias signal (e.g., VBIAS). The bias signal VBIAS may be configured to provide a bias voltage to the cross-coupled differential transconductance circuit 122.

In an example, a signal (e.g., FINE_CONT) may be presented to an input of the fine-tuning switched-capacitor bank 126. The signal FINE_CONT may be configured to set a capacitance value of the fine-tuning switched-capacitor bank 126. In an example, the signal FINE_CONT may be implemented as a 4-bit signal (e.g., FINE_CONT<3:0>). However, other numbers of bits may be implemented to meet design criteria of a particular application. In an example, the signal FINE_CONT<3:0> may comprise a first portion of bits of the signal CPCTRL<N:0>. When the signal CPCTRL<N:0> is implemented having 7 bits, the signal FINE_CONT<3:0> may comprise a least significant 4 bits (e.g., CPCTRL<3:0>) of the signal CPCTRL<6:0>.

In an example, a signal (e.g., CRS_CONT) may be presented to an input of the coarse-tuning switched-capacitor bank 128. The signal CRS_CONT may be configured to set a capacitance value of the coarse-tuning switched-capacitor bank 128. In an example, the signal CRS_CONT may be implemented as a 3-bit signal (e.g., CRS_CONT<2:0>). However, other numbers of bits may be implemented to meet design criteria of a particular application. In an example, the signal CRS_CONT<2:0> may comprise a second portion of bits of the signal CPCTRL<N:0>. When the signal CPCTRL<N:0> is implemented having 7 bits, the signal CRS_CONT<2:0> may comprise a most significant 3 bits (e.g., CPCTRL<6:4>) of the signal CPCTRL<6:0>.

In an example, the signal VCTRL may be presented to a first control input of the varactor circuit 130 and the signal KVCO_HV may be presented to a second control input of the varactor circuit 130. The signal VCTRL and the signal KVCO_HV may be configured to set a capacitance value of the varactor circuit 130. Thus, the capacitance provided by the fine-tuning switched-capacitor bank 126, the coarse-tuning switched-capacitor bank 128, and the varactor circuit 130 is generally controlled (set) in response to the signals FINE_CONT, CRS_CONT, KVCO_HV, and VCTRL. In an example, the signals FINE_CONT and CRS_CONT may be configured to select between a number of overlapped tuning sub-bands to enable a voltage range of the signal VCTRL to compensate for frequency variation due to temperature variation and frequency step size due to calibration.

In an example, the circuit 122 may comprise a resistor R1, a resistor R2, a capacitor C1, a capacitor C2, a transistor P0, a transistor P1, a transistor N0, and a transistor N1. In an example, the capacitors C1 and C2 may each be implemented as one or more vertical natural capacitors (VN-CAPs). In various embodiments, the capacitors C1 and C2 may have the same value (e.g., $C_{BIAS}$). In an example, the capacitors C1 and C2 may each be implemented having a capacitance of 156 fF. In an example, each of the capacitors C1 and C2 may be implemented as four capacitor sections connected in parallel (e.g., illustrated in FIG. 10). In an embodiment implementing each of the capacitors C1 and C2 as four capacitor sections connected in parallel, the capacitors C1 and C2 may each comprise four 39 femtoFarad (fF) capacitors connected in parallel for a total capacitance of 156 fF. In various embodiments, the resistors R1 and R2 may have the same value (e.g., $R_{BIAS}$). In an example, the value $R_{BIAS}$ may be implemented as 21.563 kiloOhms (kΩ).

In various embodiments, a LC-VCO topology with core transistors operating in a Class-C mode may be implemented for low phase noise and wide tuning range. A typical arrangement of a Class-C oscillator may have the gate of one transistor in the cross-coupled pair ac-coupled with the drain of the other transistor in the cross-coupled pair, using the capacitors C1 and C2. In addition, a common dc-bias voltage (e.g., VBIAS) may be applied at the gates of the cross-coupled transistors through the resistors R1 and R2. The resistance value (e.g., $R_{BIAS}$) of the resistors R1 and R2, and the capacitance values (e.g., $C_{BIAS}$) of the capacitors C1 and C2 are generally chosen to have an appropriate value that does not affect VCO phase noise and/or frequency tuning range. The transistors P0 and P1 may be implemented as p-channel metal-oxide-semiconductor (PMOS) transistors. The transistors N0 and N1 may be implemented as n-channel metal-oxide-semiconductor (NMOS) transistors. In an example, the transistors P0, P1, N0, and N1 may be implemented having a gate length of 0.1 µm. A large enough W/L ratio of the P0, P1, N0, and N1 and a low enough bias voltage VBIAS to obtain enough transconductance (gm) to oscillate, good phase noise, and good common voltage near AVDD/2. In an example, a resistor voltage divider may be used to generate the bias voltage VBIAS. In an example, the signal VBIAS may be used to control the transconductance (gm) provided by the amplifier core. In an example, resistor values of the voltage divider should be small enough not to affect phase noise more than a 1 MHz offset.

An output of the low-noise voltage supply 120 may be connected to a source terminal of the PMOS transistor P0 and a source terminal of the PMOS transistor P1. A gate terminal of the PMOS transistor P0 may be connected to a first terminal of the resistor R1 and a first terminal of the capacitor C1. A gate terminal of the PMOS transistor P1 may be connected to a first terminal of the resistor R2 and a first terminal of the capacitor C2. A second terminal of the resistor R1 may be connected to a second terminal of the resistor R2. The bias signal VBIAS may be presented to a node formed by the connection of the second terminal of the resistor R1 and the second terminal of the resistor R2. A drain terminal of the PMOS transistor P0 may be connected to a drain terminal of the NMOS transistor N0, a second terminal of the capacitor C2, a gate terminal of the NMOS transistor N1, and the first output $VCO_P$ of the LCVCO 108. A drain terminal of the PMOS transistor P1 may be connected to a drain terminal of the NMOS transistor N1, a second terminal of the capacitor C1, a gate terminal of the NMOS transistor N0, and the second output $VCO_N$ of the LCVCO 108. A source terminal of the NMOS transistor N0 and a source terminal of the NMOS transistor N1 may be connected to the circuit ground potential.

Figure 3A:
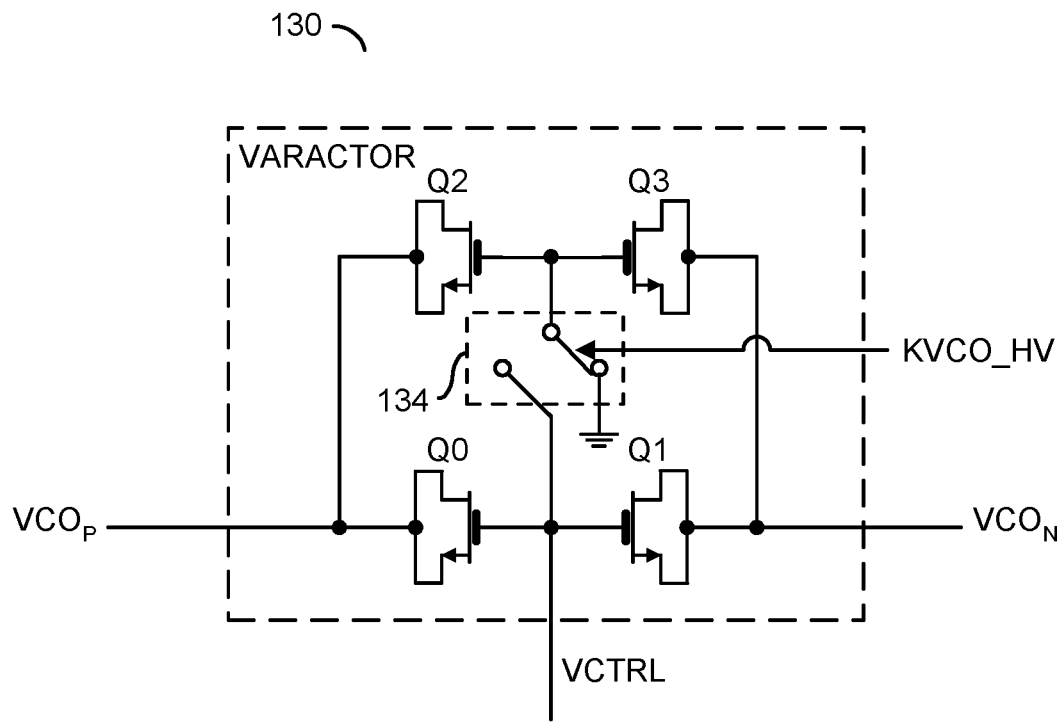
FIGS. 3A and 3B are diagrams illustrating a thick oxide varactor circuit in accordance with an embodiment of the invention.

Referring to FIG. 3A, a diagram is shown illustrating an exemplary circuit implementation of the thick oxide varactor circuit 130 in accordance with an embodiment of the invention. In an example, the thick oxide varactor circuit 130 may comprises a first thick oxide varactor Q0, a second thick oxide varactor Q1, a third thick oxide varactor Q2, a fourth thick oxide varactor Q3, and a switch 134. In an example, the thick oxide varactors Q1, Q2, Q3, and Q4 may be implemented as variable MOS capacitors. In various embodiments, the thick oxide varactors Q1 and Q2, and the thick oxide varactors Q3 and Q4 are reverse connected (e.g., gate terminals are connected to a control voltage and drain/source terminals are connected to a differential output of the VCO). The use of thick oxide varactors and the reverse varactor connection generally provide a wider frequency range (e.g., larger $K_{VCO}$).

In an example, a gate terminal of the first varactor Q0 may be connected to a gate terminal of the second varactor Q1. A gate terminal of the third varactor Q2 may be connected to a gate terminal of the fourth varactor Q3. The signal VCTRL may be presented to a node formed by the connection of the gate terminal of the first varactor Q0, the gate terminal of the second varactor Q1, and a first terminal of the switch 134. A second terminal of the switch 134 may be connected to the circuit ground potential. A common terminal of the switch 134 may be connected to a node formed by the connection of the gate terminal of the third varactor Q2 to the gate terminal of the fourth varactor Q3. A source/drain terminal of the first varactor Q0 and a source/drain terminal of the third varactor Q2 may be connected to the first output $VCO_P$ of the LCVCO 108. A source/drain terminal of the second varactor Q1 and a source/drain terminal of the fourth varactor Q3 may be connected to the second output $VCO_N$ of the LCVCO 108. The signal KVCO_HV may be presented to a control terminal of the switch 134. In an example, the signal KVCO_HV may comprise a control bit providing flexibility to increase the tuning range $K_{VCO}$ of the LCVCO 108. In an example, when the signal KVCO_HV is in a first state, the node formed by the connection of the gate terminal of the third varactor Q2 to the gate terminal of the fourth varactor Q3 may be connected to the circuit ground potential. When the signal KVCO_HV is in a second state, the signal VCTRL is presented to the node formed by the connection of the gate terminal of the third varactor Q2 to the gate terminal of the fourth varactor Q3.

Figure 3B:
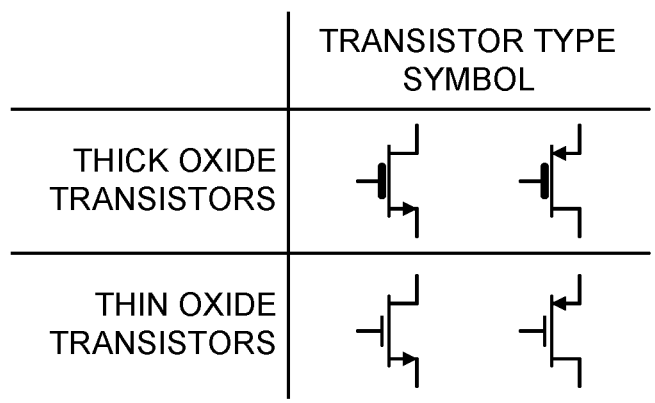

Referring to FIG. 3B, a diagram is shown illustrating an exemplary thick and thin film (gate oxide) transistor notation (symbols) as employed in FIG. 3A and in subsequent figures. The drain current of a MOSFET in conduction is inversely proportional to the thickness of the gate oxide. The speed of CMOS logic is proportional to the drain current. A large oxide thickness has benefits for current leakage, but makes slow logic. With a voltage supply of 1.2V and 1.2V thick oxide, NMOS transistor resistance is large and the threshold voltages ($V_{th}$) of PMOS and NMOS transistors are high. If 1.2V MOS transistors are used, the switch resistance is high and transconductance ($g_m$) is low, which may make it difficult for the LCVCO 108 to reach 12 GHz and have good phase noise. A small oxide thickness provides a faster device, but at the risk of dielectric breakdown due to a high electric field developing.

In various embodiments, thick oxide varactors and the reverse varactor connection are used generally to provide a wider frequency range (e.g., larger $K_{VCO}$), while thin oxide switches are used generally for the switched-capacitor banks to reduce switch resistance and have a better Q-factor. In an example, the thick oxide varactors may have a minimum gate length of about 0.15 μm and the thin oxide switches may have a minimum gate length of 0.004 μm. In general, switch resistance is inversely proportional to width (W) divided by gate length (L). Less gate length needs less width to have small switch resistance and less drain-source capacitance (e.g., $C_{ds}$). As would be apparent to those skilled in the art, as CMOS processing migrates to smaller and smaller geometries, the oxide thicknesses that are considered "thick" or "thin" that provide the same functions will not necessarily be the same thickness as at the geometries described herein.

Figure 4:
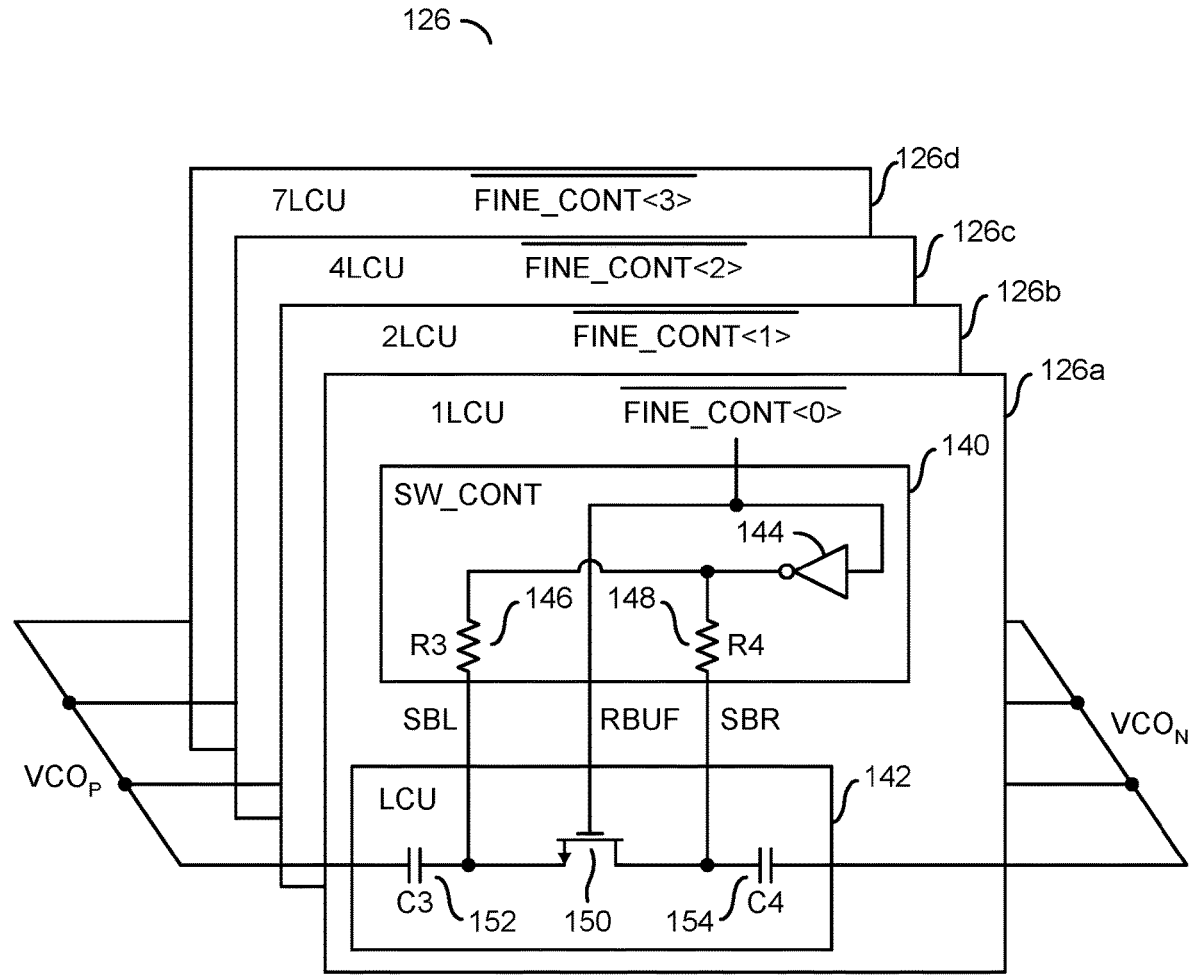
FIGS. 4-7 are diagrams illustrating a fine tuning capacitor bank in accordance with an embodiment of the invention.

Referring to FIG. 4, a diagram is shown illustrating an example circuit implementation of a fine-tuning switched-capacitor bank in accordance with an embodiment of the invention. In an example, the fine-tuning switched-capacitor bank 126 may be implemented as a 4-bit switched-capacitor bank. In an example, the fine-tuning switched-capacitor bank 126 may comprise a first bank 126a, a second bank 126b, a third bank 126c, and a fourth bank 126d. Each of the four banks 126a, 126b, 126c, and 126d may receive a complement version of a respective one of the bits of the signal FINE-CONT<3:0>. In an example, inverters may be used to generate the complement versions from true versions of the bits of the signal FINE-CONT<3:0>. The four banks 126a, 126b, 126c, and 126d are generally connected in parallel between the first output $VCO_P$ and the second output $VCO_N$ of the LCVCO 108.

In an example, the each of banks 126a-126d may comprise a switching control (SW_CONT) circuit 140 and one or more least capacitance unit (LCU) circuits 142. In an example, the first bank 126a may comprise one LCU circuit 142, the second bank 126b may comprise two LCU circuits 142, the third bank 126c may comprise four LCU circuits 142, and the fourth bank 126d may comprise seven LCU circuit 142. In an example, the switching control circuit 140 may have an input that may receive the complement version of the respective bit of the signal FINE_CONT<3:0>, a first output that may present a signal (e.g., SBL), a second output that may present a signal (e.g., RBUF), and a third output that may present a signal (e.g., SBR). In an example, the LCU circuit 142 may have a first input that may receive the signal SBL, a second input that may receive the signal RBUF, a third input that may receive the signal SBR, a first output that may be connected to the first output $VCO_P$ of the LCVCO 108, and a second output that may be connected to the second output $VCO_N$ of the LCVCO 108.

In an example, the switching control circuit 140 may comprise an inverter 144, a resistor 146, and a resistor 148. In an example, the resistor 146 may be implemented with exemplary resistance value of R3 and the resistor 148 may be implemented with exemplary resistance value of R4. In an example, the complement version of the respective bit of the signal FINE_CONT may be presented to an input of the inverter 144 and at the second output of the circuit 140 as the signal RBUF. An output of the inverter 144 may be connected to a first terminal of the resistor 146 and a first terminal of the resistor 148. A second terminal of the resistor 146 may be connected to the first output of the circuit 140 and present the signal SBL. A second terminal of the resistor 148 may be connected to the third output of the circuit 140 and present the signal SBR.

In an example, the LCU circuit 142 may comprise a switch 150, a capacitor 152, and a capacitor 154. In an example, the switch 150 may be implemented using an NMOS transistor. In an example, a small oxide thickness may be implemented to provide a faster device. In an example, the capacitor 152 and the capacitor 154 may be implemented as VNCAPs. In an example, the capacitor 152 may be implemented with exemplary capacitance value of C3 and the capacitor 154 may be implemented with exemplary capacitance value of C4. In an example, the signal RBUF may be presented to a gate terminal of the transistor switch 150. A source terminal of the transistor switch 150 may be connected to a first terminal of the capacitor 152. A drain terminal of the transistor switch 150 may be connected to a first terminal of the capacitor 154. The signal SBL may be presented to a node formed by connection of the source terminal of the transistor switch 150 and the first terminal of the capacitor 152. The signal SBR may be presented to a node formed by connection of the drain terminal of the transistor switch 150 and the first terminal of the capacitor 154. A second terminal of the capacitor 152 may be connected to the first output of the LCU circuit 142. A second terminal of the capacitor 154 may be connected to the second output of the LCU circuit 142.

In an example, the switched-capacitor banks 126a-126d are generally implemented comprising a single switch vncap structure. Compared to a double switch vncap structure, the single switch vncap structure reduces the losses from transistor switches to half of the double switch structure. Additionally, the possibility of forward biasing source and drain junction diodes during large signal operation is not present since the DC voltage at the source terminal and drain terminal of the transistor switch 150 is set to the power supply voltage (via the resistors 146 and 148) when the transistor switch 150 is off. In an example, the resistor 146 and the resistor 148 may have the same value (e.g., $R_B$). In various embodiments, the value $R_B$ is generally chosen to be sufficiently high for the resistance of the transistor switch 150 to be high when off. In an example, the value $R_B$ is chosen to be significantly higher than the resistance of the transistor switch 150 when off. In an example, the value $R_B$ may be implemented as about 213.67 kiloOhms (kΩ).

Figure 15:
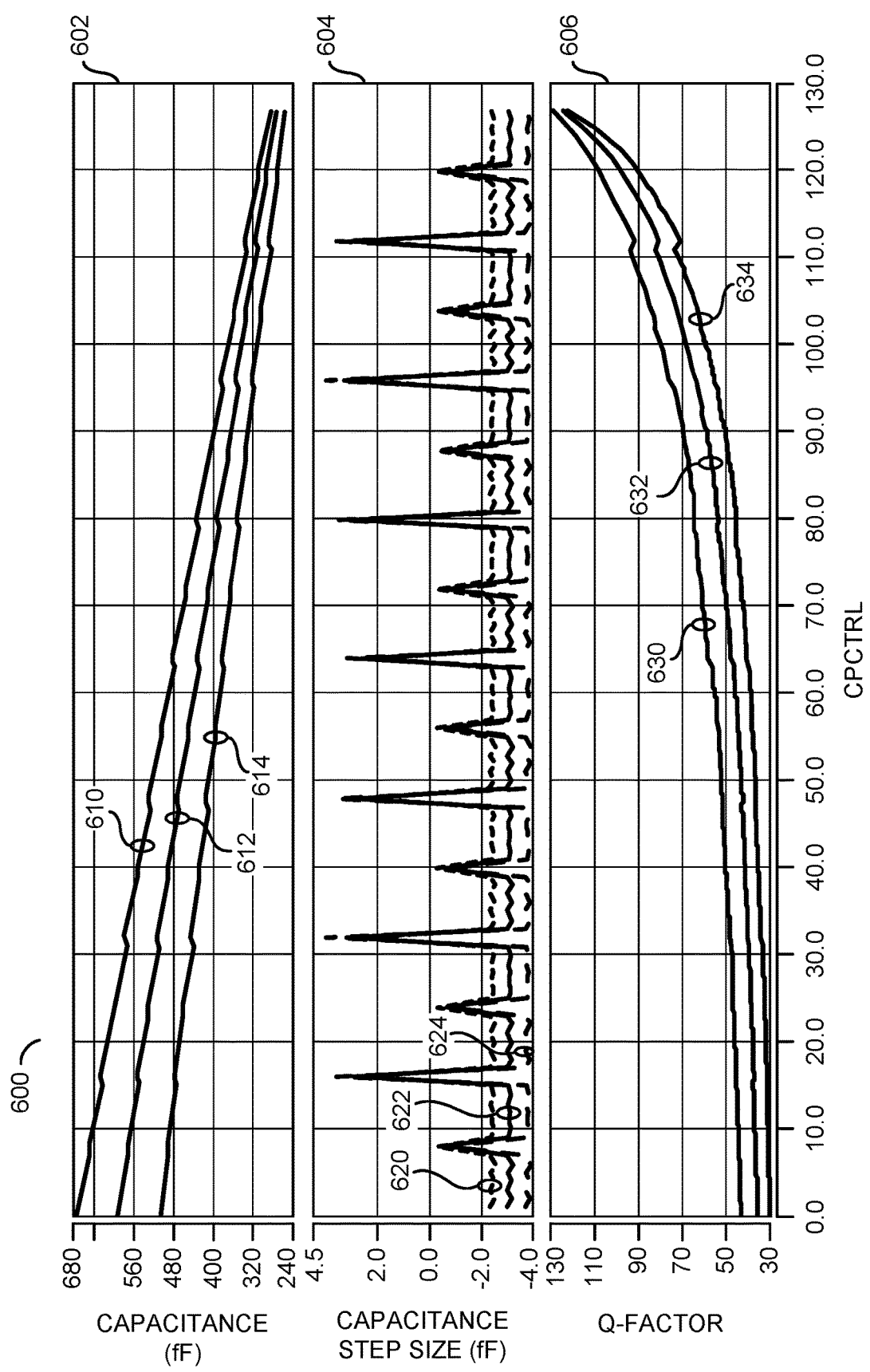
FIG. 15 is a diagram illustrating capacitor bank C and Q parameters over a control input range over a capacitor bank control input range.

In general, the VCO frequency is determined by the LC-tank, and may be expressed by the following Equation 1:

$$f_{VCO} = \frac{1}{2\Pi\sqrt{LC_{total}}} \qquad \text{EQ. 1}$$

where L is the inductance of the inductor 124 and $C_{total}$ is the sum of the capacitances of the switched-capacitor banks 126 and 128, the varactor circuit 130, the transistors P0, P1, N0, N1, the interconnections, cross coupling. In various embodiments, the capacitance of the switched-capacitor banks is chosen to be significantly greater than the other capacitances to facilitate tuning the VCO frequency. In determining a step size to be implemented by the switched-capacitor banks 126 and 128, a $C_{total}$ value may be determined for a frequency range of 12 GHz±10% at a typical/nominal corner in order to cover frequency variation over PVT. In an example, an inductance value of about 231.9 pH at 12 MHz may be chosen for the inductor 124. Applying Equation 1 above, a VCO frequency of 12 GHz+10% may be obtained when $C_{total}$ is 627 fF, a VCO frequency of 12 GHz may be obtained when $C_{total}$ is 759 fF, and a VCO frequency of 12 GHz−10% may be obtained when $C_{total}$ is 936 fF. Thus, a capacitance range that the switched-capacitor banks 126 and 128 need to cover is about 310 fF. In embodiments implementing the switched-capacitor banks 126 and 128 having a 7-bit control signal (e.g., CPCTRL<6:0>), a step size of 2.44 fF is needed (e.g., 310 fF/127=2.44 fF). To avoid a frequency jump when changing from least significant bit (LSB) to most significant bit (MSB), a minus frequency step size needs to be implemented from LSB to MSB. Thus the step size needs to cover a little more than 2.44 fF. In an example, a step size of 3 fF may be chosen (e.g., as illustrated in FIG. 15).

Figure 5:
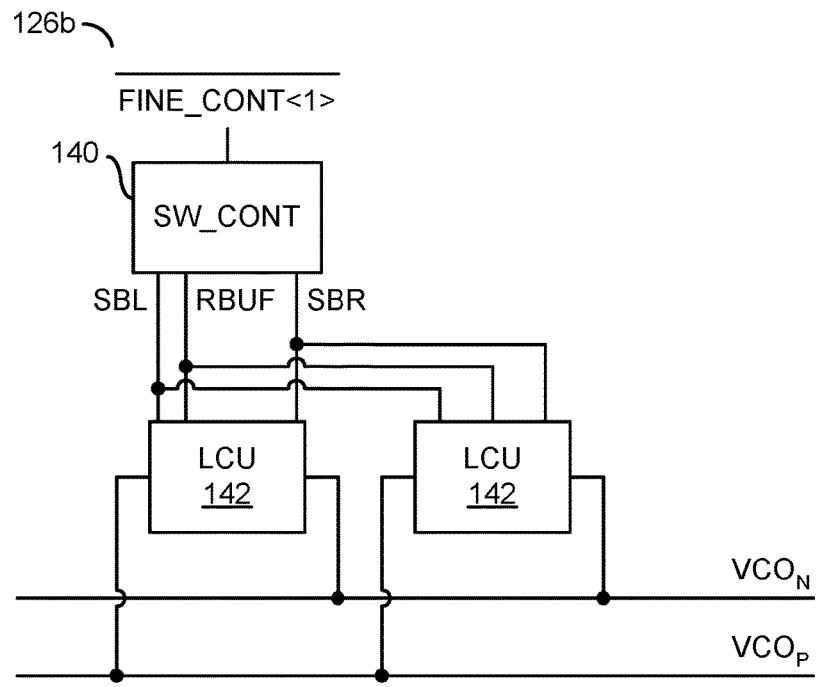

Referring to FIG. 5, a diagram is shown illustrating an example circuit implementation of the circuit 126b of the fine-tuning switched-capacitor bank 126 of FIG. 4. In an example, the circuit 126b may comprise a single instance of the switching control circuit 140 and two instances of the LCU circuit 142. The two instances of the LCU circuit 142 are generally connected in parallel between the switching control circuit 140 and the outputs of the LCVCO 108.

Figure 6:
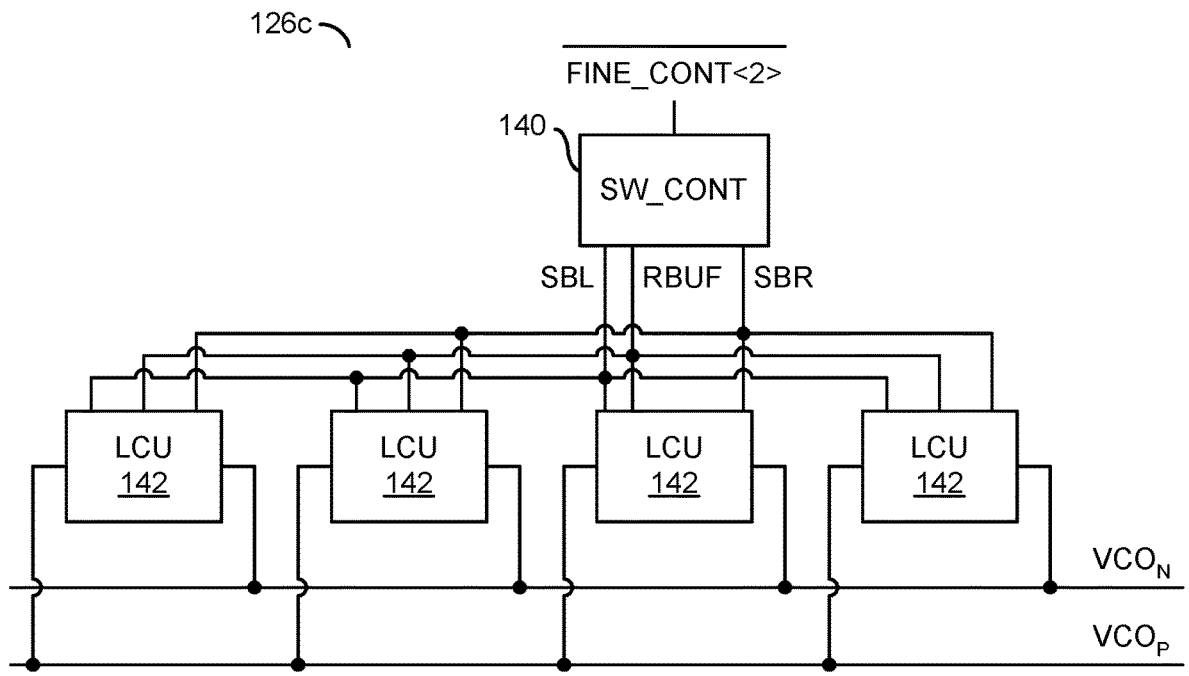

Referring to FIG. 6, a diagram is shown illustrating an example circuit implementation of the circuit 126c of the fine-tuning switched-capacitor bank 126 of FIG. 4. In an example, the circuit 126c may comprise a single instance of the switching control circuit 140 and four instances of the LCU circuit 142. The four instances of the LCU circuit 142 are generally connected in parallel between the switching control circuit 140 and the outputs of the LCVCO 108.

Figure 7:
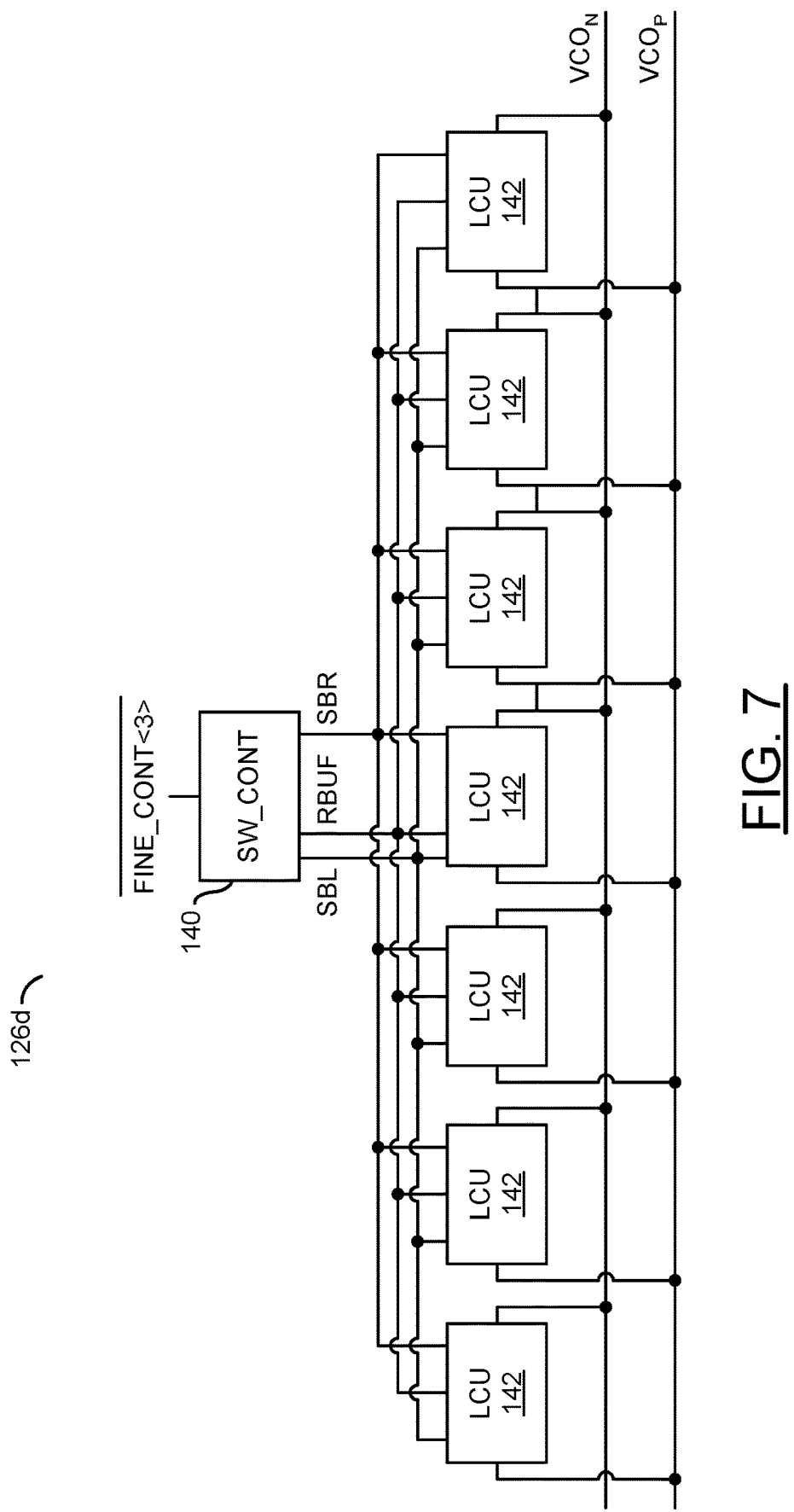

Referring to FIG. 7, a diagram is shown illustrating an example circuit implementation of the circuit 126d of the fine-tuning switched-capacitor bank 126 of FIG. 4. In an example, the circuit 126d may comprise a single instance of the switching control circuit 140 and seven instances of the LCU circuit 142. The seven instances of the LCU circuit 142 are generally connected in parallel between the switching control circuit 140 and the outputs of the LCVCO 108.

Figure 8A:
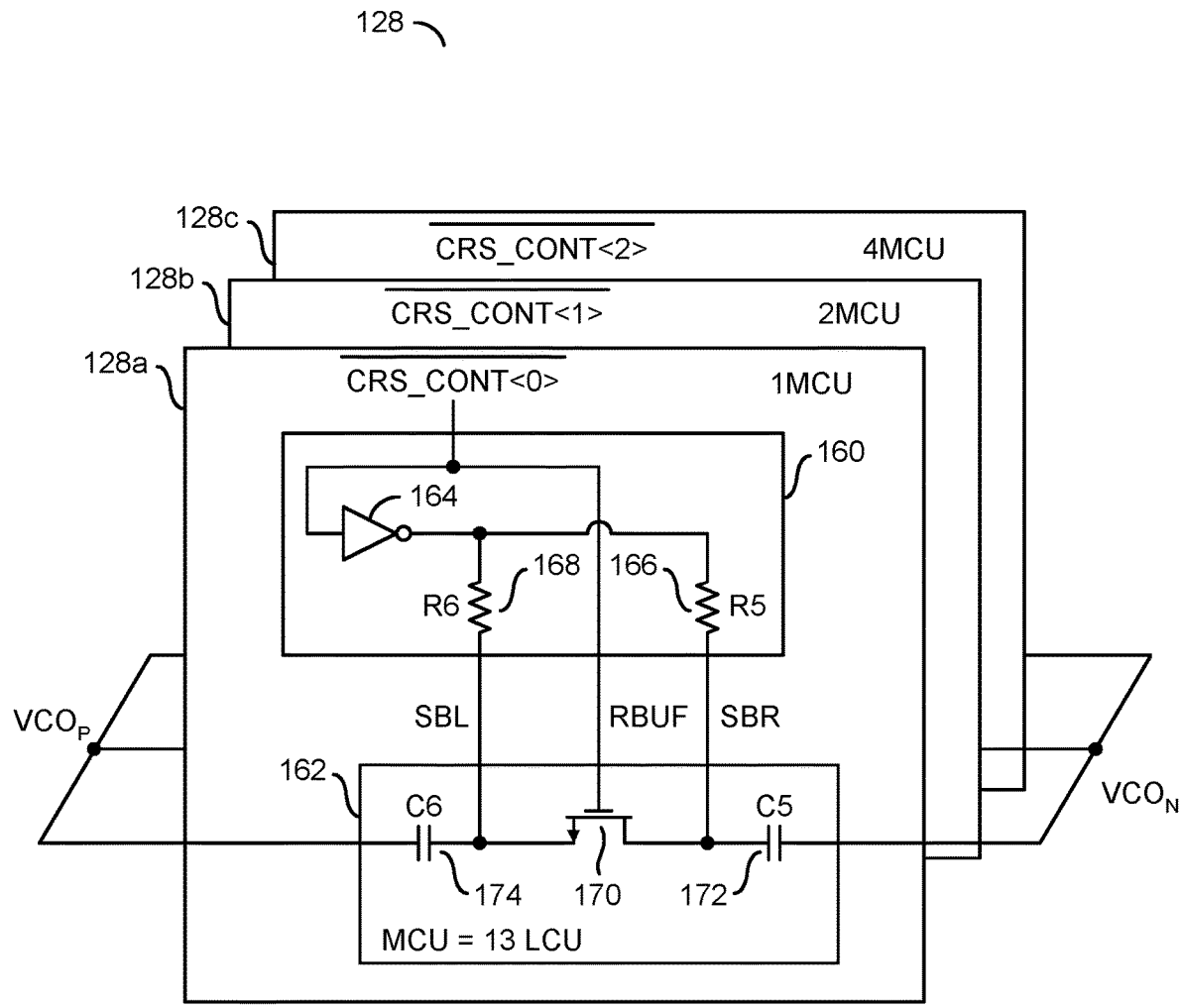
FIGS. 8A-8C are drawings illustrating a coarse tuning capacitor bank in accordance with an embodiment of the invention.

Referring to FIG. 8A, a diagram is shown illustrating an example circuit implementation of a coarse-tuning switched-capacitor bank in accordance with an embodiment of the invention. In an example, the coarse-tuning switched-capacitor bank 128 may be implemented as a 3-bit switched-capacitor bank. In an example, the coarse-tuning switched-capacitor bank 128 may comprise a first bank 128a, a second bank 128b, and a third bank 128c. Each of the three banks 128a, 128b, and 126c may receive a respective one of the bits of the signal CRS-CONT<2:0>. The three banks 128a, 128b, and 128c are generally connected in parallel between the first output $VCO_P$ and the second output $VCO_N$ of the LCVCO 108.

In an example, the each of banks 128a-128c may comprise a switching control (SW_CONT) circuit 160 and one or more macro capacitance unit (MCU) circuits 162. In various embodiments, the MCU circuit 162 comprises thirteen instances of the LCU circuit 142 connected in parallel. In an example, the first bank 128a may comprise one MCU circuit 162, the second bank 128b may comprise two MCU circuits 162, and the third bank 128c may comprise four MCU circuits 162. In an example, the switching control circuit 160 may have an input that may receive a complement version of the respective bit of the signal CRS_CONT<2:0>, a first output that may present the signal SBL, a second output that may present the signal RBUF, and a third output that may present the signal SBR. In an example, the MCU circuit 162 may have a first input that may receive the signal SBL, a second input that may receive the signal RBUF, a third input that may receive the signal SBR, a first output that may be connected to the first output $VCO_P$ of the LCVCO 108, and a second output that may be connected to the second output $VCO_N$ of the LCVCO 108.

In an example, the switching control circuit 160 may comprise an inverter 164, a resistor 166, and a resistor 168. In an example, the resistor 166 may be implemented with exemplary resistance value of R5 and the resistor 168 may be implemented with exemplary resistance value of R6. In an example, the resistors R5 and R6 may be implemented having similar resistance values that are substantially greater then the NMOS switch resistance (e.g., 218.12 kOhm). In an example, the complement version of the respective bit of the signal CRS_CONT may be presented to an input of the inverter 164 and at the second output of the circuit 160 as the signal RBUF. An output of the inverter 164 may be connected to a first terminal of the resistor 166 and a first terminal of the resistor 168. A second terminal of the resistor 166 may be connected to the first output of the circuit 160 and present the signal SBL. A second terminal of the resistor 168 may be connected to the third output of the circuit 160 and present the signal SBR.

In an example, the MCU circuit 162 may comprise a switch 170, a capacitor 172, and a capacitor 174. In an example, the switch 170 may be implemented using an NMOS transistor. In an example, a small oxide thickness may be implemented to provide a faster device. In an example, the capacitor 172 may be implemented with exemplary capacitance value of C5 and the capacitor 174 may be implemented with exemplary capacitance value of C6. In an example, the capacitance values may be selected (e.g., similarly to the LCU capacitors) to make a frequency step size negative when control bits change from LSB to MSB to minimize the control voltage difference between frequency lock and calibration. In an example, the signal RBUF may be presented to a gate terminal of the transistor switch 170. A drain terminal of the transistor switch 170 may be connected to a first terminal of the capacitor 172. A source terminal of the transistor switch 170 may be connected to a first terminal of the capacitor 174. The signal SBL may be presented to a node formed by connection of the source terminal of the transistor switch 170 and the first terminal of the capacitor 174. The signal SBR may be presented to a node formed by connection of the drain terminal of the transistor switch 170 and the first terminal of the capacitor 172. A second terminal of the capacitor 174 may be connected to the first output of the MCU circuit 162. A second terminal of the capacitor 172 may be connected to the second output of the MCU circuit 162.

Figure 8B:
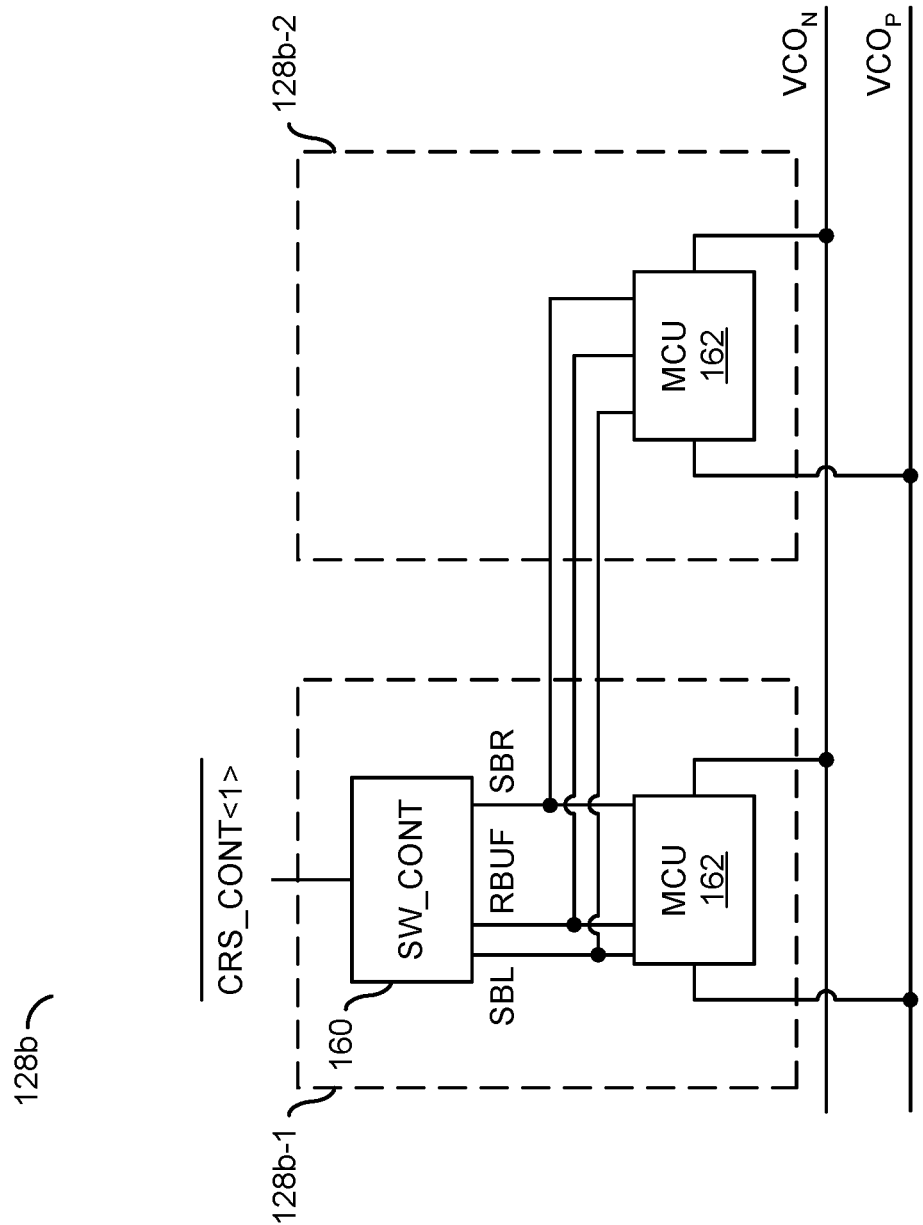

Referring to FIG. 8B, a diagram is shown illustrating an example embodiment of the coarse-tuning switched-capacitor bank 128b. In an example, the coarse-tuning switched-capacitor bank 128b may comprise a single instance of the switching control circuit 160 and two instances of the MCU circuit 162. The two instances of the MCU circuit 162 are generally connected in parallel between the switching control circuit 160 and the outputs of the LCVCO 108. In some embodiments, the coarse-tuning switched-capacitor bank 128b may be implemented comprising a first portion 128b-1 and a second portion 128b-2. The first portion 128b-1 may comprise the single instance of the switching control circuit 160 and a first instance of the MCU circuit 162. The second portion 128b-2 may comprise a second instance of the MCU circuit 162. In various embodiments, the two portions 128b-1 and 128b-2 of the coarse-tuning switched-capacitor bank 128b generally allow the coarse-tuning switched-capacitor bank 128b to be placed around other circuitry on an integrated circuit die (e.g., in a common centroid layout arrangement).

Figure 8C:
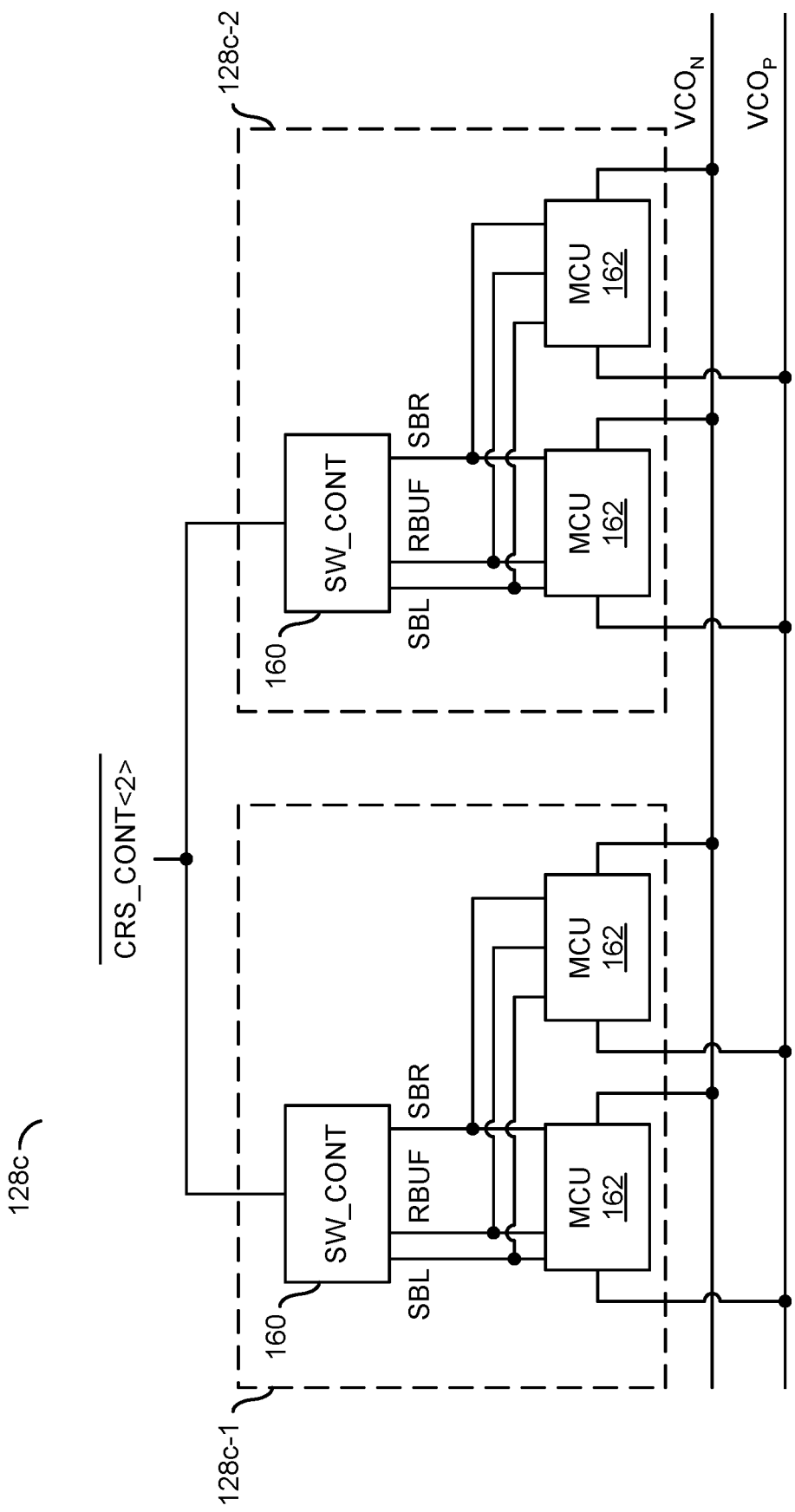

Referring to FIG. 8C, a diagram is shown illustrating an example embodiment of the coarse-tuning switched-capacitor bank 128c. In an example, the coarse-tuning switched-capacitor bank 128c may be implemented similarly to the fine-tuning switched-capacitor bank 126c (described in connection with FIG. 6 above). In an example, the coarse-tuning switched-capacitor bank 128c may be implemented, comprising a single instance of the switching control circuit 160 and four instances of the MCU circuit 162. The four instances of the MCU circuit 162 are generally connected in parallel between the switching control circuit 160 and the outputs of the LCVCO 108.

In another example, the coarse-tuning switched-capacitor bank 128c may be implemented comprising a first portion 128c-1 and a second portion 128c-2. The first portion 128c-1 may comprise a first instance of the switching control circuit 160 and two instances of the MCU circuit 162 connected in parallel between the first instance of the switching control circuit 160 and the outputs of the LCVCO 108. The second portion 128c-2 may comprise a second instance of the switching control circuit 160 and two instances of the MCU circuit 162 connected in parallel between the second instance of switching control circuit 160 and the outputs of the LCVCO 108. In various embodiments, the two portions 128c-1 and 128c-2 of the coarse-tuning switched-capacitor bank 128c generally allow the coarse-tuning switched-capacitor bank 128c to be placed around other circuitry on an integrated circuit die (e.g., in a common centroid layout arrangement).

Figure 9:
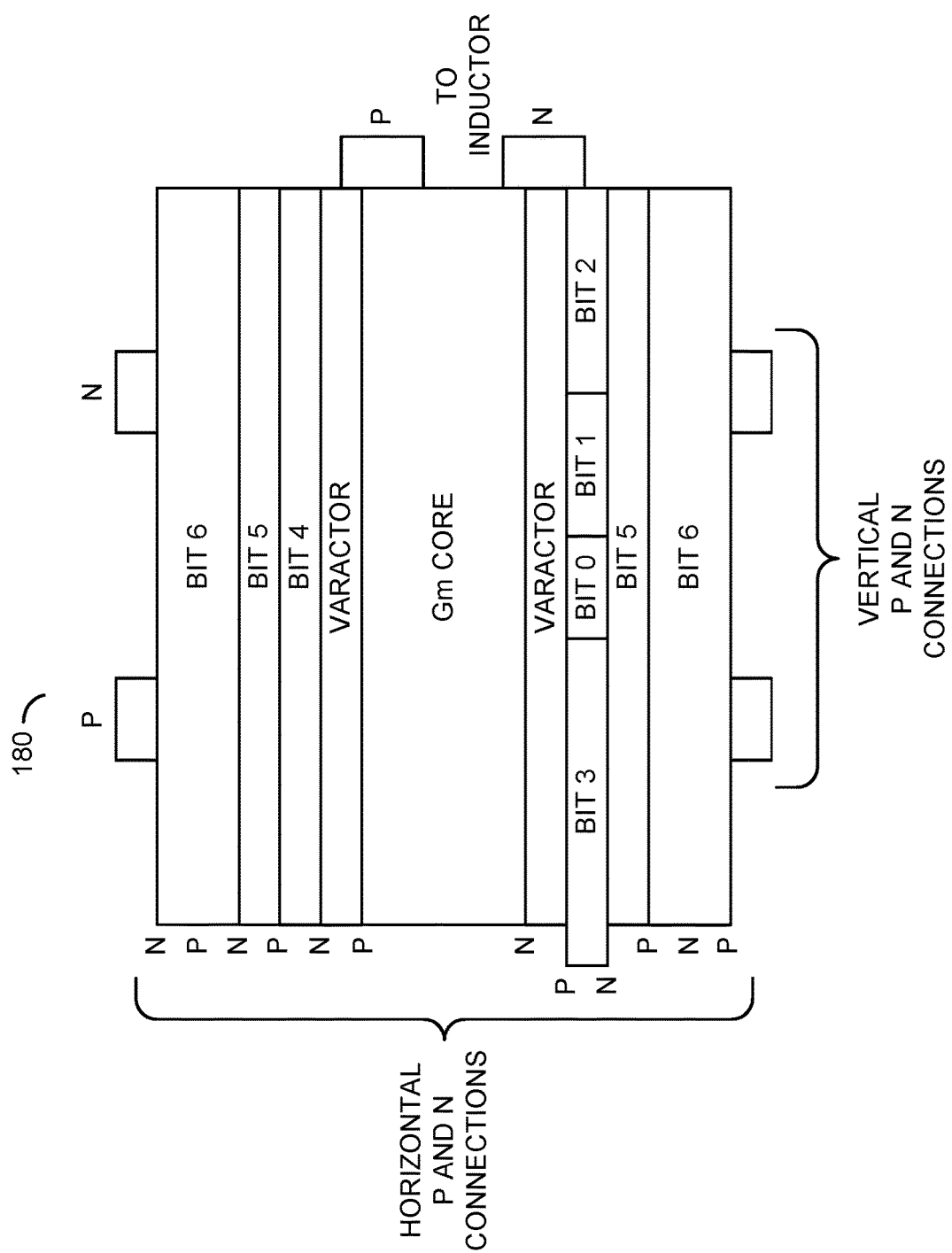
FIG. 9 is a diagram illustrating a common centroid layout arrangement of the LCVCO circuit of FIG. 2 in accordance with an embodiment of the invention.

Referring to FIG. 9, a diagram is shown illustrating a common centroid layout arrangement 180 of the LCVCO circuit 108 of FIG. 2 in accordance with an embodiment of the invention. In various embodiments, the LCVCO circuit 108 is generally implemented using a common centroid layout method. In an example, the switched-capacitor banks 126 and 128 and the varactor circuit 130 are disposed around the cross-coupled differential transconductance (gm) amplifier core 122. The common centroid layout arrangement with the capacitor banks 126 and 128 and the varactor circuit 130 distributed on either side of the amplifier core 122 generally provides a better Q-factor in 4 nm process. The layout of the MOS and varactor devices generally reduces gate resistance and coupling. In various embodiments, the horizontal p and n connections of the various circuits are implemented in upper metal layers (e.g., metal layers 10-13, layers D10-IA in Samsung 4 nm process) of the integrated circuit with a narrow width (e.g., about 1.163 μm) and the p and n output connections are generally implemented in a vertical direction in the upper metal layers (e.g., metal layer 14, IB in Samsung 4 nm process) having a wider width (e.g., about 10 μm) to minimize metal resistance. In an example, the p and n output connections are implemented equal and symmetrical. In an example, the inductor 124 may also be implemented in the upper metal layers (e.g., metal layers 13-15, IA/IB/LB in Samsung 4 nm process) of the integrated circuit.

Figure 10:
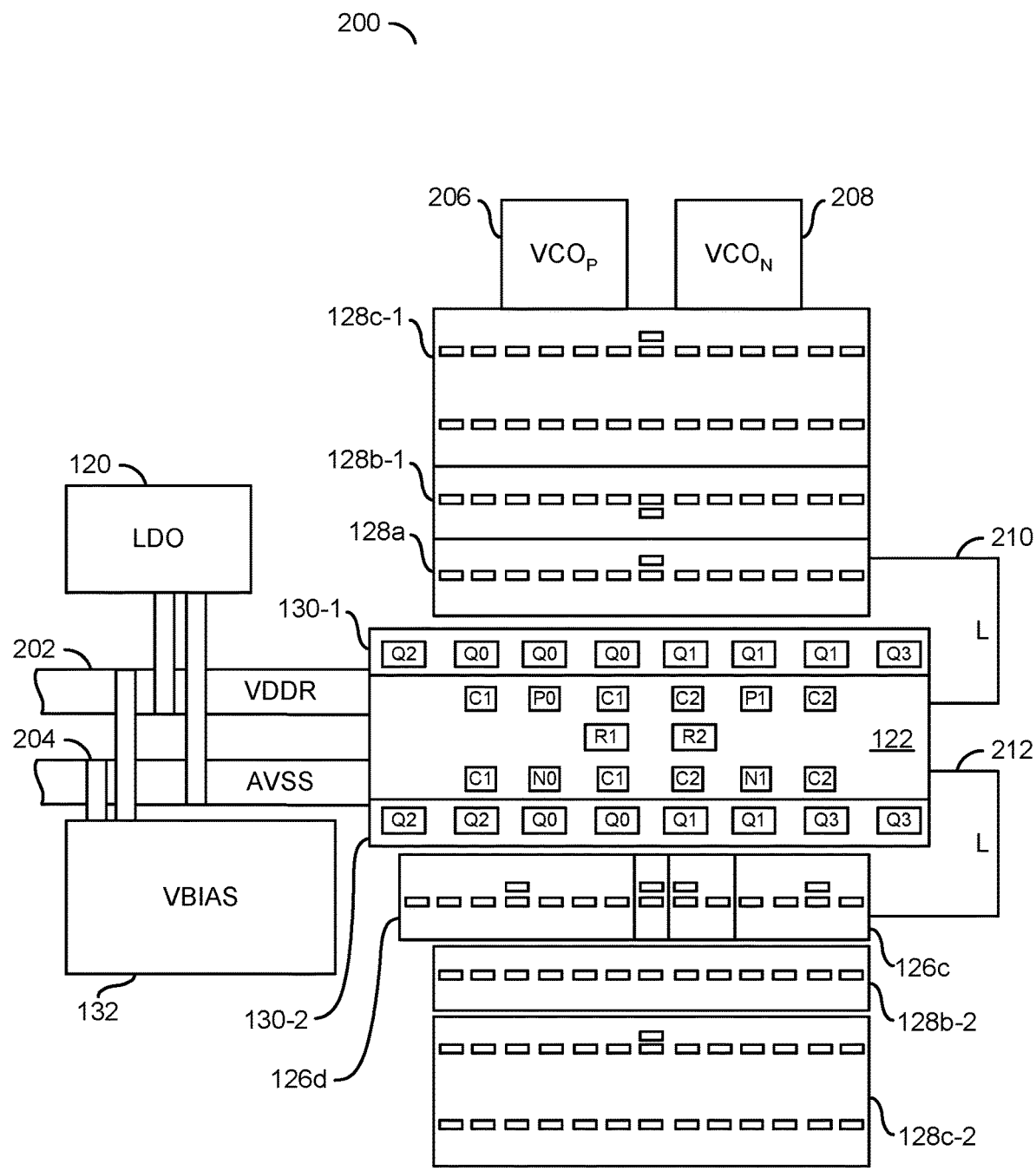
FIG. 10 is a diagram illustrating an integrated circuit layout of the LCVCO circuit of FIG. 2 in accordance with an embodiment of the invention.

Referring to FIG. 10, a diagram is shown illustrating an example integrated circuit layout 200 of the LCVCO circuit 108 of FIG. 2 in accordance with an embodiment of the invention. In various embodiments, the LCVCO circuit 108 may be laid out on an integrated circuit or system-on-chip (SoC) with the cross-coupled differential transconductance (gm) amplifier core 122 at the center. In an example, the capacitor C1 may be implemented comprising four sections that are disposed around the MOS transistors P0 and N0, the capacitor C2 may be implemented comprising four sections that are disposed around the MOS transistors P1 and N1, and the resistors R1 and R2 may be disposed centered between the MOS transistors P0, P1, N0, and N1. The thick oxide varactor circuit 130 may be implemented comprising a first portion 130-1 and a second portion 130-2 disposed, above and below respectively, adjacent to the cross-coupled differential transconductance (gm) amplifier core 122. The fine-tuning switched-capacitor banks 126a-126d may be disposed below and adjacent to the second portion 130-2 of the thick oxide varactor circuit 130, with the fine-tuning switched-capacitor banks 126a and 126b between the fine-tuning switched-capacitor banks 126c and 126d. Placing the fine-tuning switched-capacitor banks 126a-126d adjacent to the second portion 130-2 of the thick oxide varactor circuit 130 generally allows connections to the cross-coupled differential transconductance (gm) amplifier core 122 to have minimal lengths. The coarse-tuning switched-capacitor bank 128a may be disposed above the first portion 130-1 of the thick oxide varactor circuit 130. The coarse-tuning switched-capacitor bank 128b may be implemented comprising a first portion 128b-1 and a second portion 128b-2. The first portion 128b-1 may be disposed above and adjacent to the coarse-tuning switched-capacitor bank 128a. The second portion 128b-2 may be disposed below and adjacent to the fine-tuning switched-capacitor banks 126a-126d. The coarse-tuning switched-capacitor bank 128c may be implemented comprising a first portion 128c-1 and a second portion 128c-2. The first portion 128c-1 may be disposed above and adjacent to the first portion 128b-1 of the coarse-tuning switched-capacitor bank 128b. The second portion 128c-2 may be disposed below and adjacent to the second portion 128b-2 of the coarse-tuning switched-capacitor bank 128b. In an example, each the portions 128c-1 and 128c-2 of the coarse-tuning switched-capacitor bank 128c may include an instance of the control circuit 160 to simplify layout by avoiding a need to route connections for the signals SBL, RBUF, and SBR between the portions 128c-1 and 128c-2 of the coarse-tuning switched-capacitor bank 128c.

In an example, horizontal traces 202 and 204 may be implemented to connect the output of the LDO regulator circuit 120 to the cross-coupled differential transconductance (gm) amplifier core 122, the switched-capacitor banks 126 and 128, the varactor circuit 130, and the bias circuit 132. Vertical traces 206 and 208 are generally implemented to provide the differential output (e.g., $VCO_P$ and $VCO_N$) of the LCVCO circuit 108. The vertical traces 206 and 208 are generally implemented equal and symmetrical with a vertical axis of the LCVCO circuit 108 layout. Horizontal traces 210 and 212 may be implemented to connect the LCVCO circuit 108 with the inductor 124 (illustrated in FIG. 11).

Figure 11:
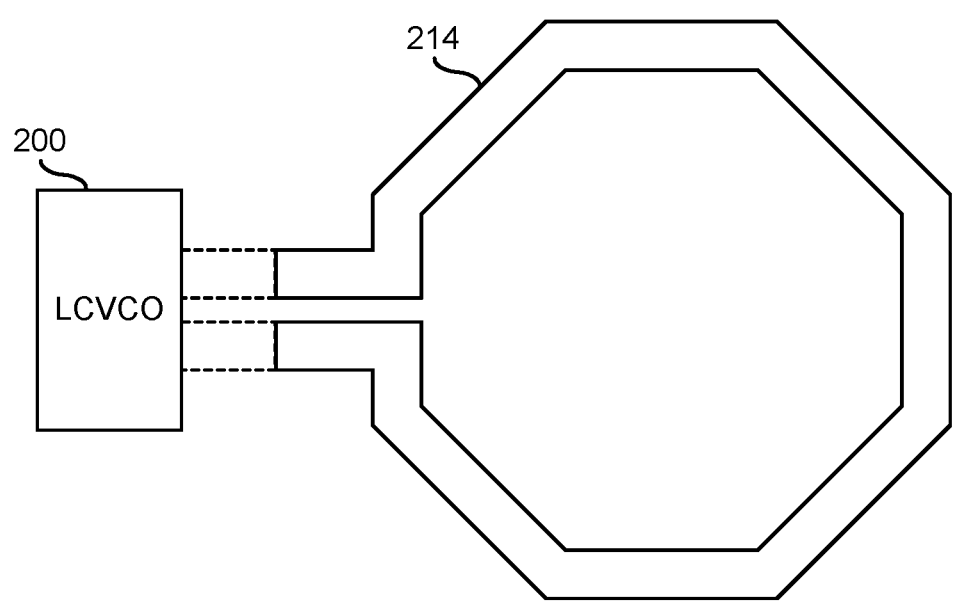
FIG. 11 is a diagram illustrating an integrated circuit layout of the LCVCO circuit of FIG. 10 connected to an inductor in accordance with an embodiment of the invention.

Referring to FIG. 11, a diagram is shown illustrating an integrated circuit layout of the LCVCO circuit of FIG. 10 connected to an integrated circuit inductor 214 implementing the inductor 124 in accordance with an embodiment of the invention. Inductors for an LCVCO may be implemented in three ways: 1) off-chip inductors, 2) bond-wire inductors, and 3) on-chip spiral inductors. In a VCO design needing a relatively low value of inductance, the inductance may be implemented with an on-chip spiral inductor to minimize additional parasitics. When the inductance needed is low enough (e.g., a few hundred picoHenries (pH)), the on-chip spiral inductor may even be designed with one turn.

The inductance of an on-chip spiral inductor may be determined using the following Equation 2:

$$L = \frac{1.07\mu_0 d_{avg} n^2}{2}\left(\ln\frac{2.29}{\rho} + 0.19\rho^2\right) \quad \text{EQ. 2}$$

where $\mu_0$ represents magnetic permeability, $d_{avg}$ represents the average outer dimension, n is the number of turns, and $\rho$ represents the filling factor. To determine the Q-factor of an on-chip spiral inductor, two major losses of inductors in CMOS technology, the metal resistance and eddy loss, are considered, as well as capacitive coupling (or parasitic capacitance). The metal resistance with the skin effect is determined based on the width, total length, and thickness of the inductor winding, the conductivity of the metal, and the skin depth. The eddy loss is determined based the thickness of the insulator between the inductor metal and the substrate, and the thickness of the substrate. The capacitive coupling is generally proportional to the width and total length of the on-chip spiral inductor. To improve the inductor Q, stacking of metal layers may be employed to reduce the metal resistance, the substrate may be lightly doped and with a deep trench to obtain high-resistivity and thus reduce eddy losses, and one or more top metal layers may be used in the inductor design to increase the distance between the substrate and the inductor metal. At a specific frequency, inductors with different outer dimensions have different inductance (L) and Q. As L increases, Q increases to a maximum value, then starts to decrease. When Q is maximum, an inductor is generally considered to be optimum at that frequency.

When the inductance needed in an application is below hundreds of pH, the inductor 214 may be designed to be one turn to avoid capacitance coupling between different turns. In an example, the inductor 214 may use top metal layers (e.g., metal layers 13-15 and the via layers between the metal layers) to reduce the parasitic capacitance. In an example, the inductor 214 may be placed in a deep trench to obtain high-resistivity and thus reduce eddy losses. In an example, the deep trench may be doped into the substrate area near the inductor to further reduce the coupling capacitance to the substrate. In an example, the inductor 214 may have a diameter of about 135 µm. To minimize the resistive loss, the inductor 214 may be implemented with a width of about 10 µm. In an example, a value of the inductor 214 may be maximized to obtain a large Q-factor and less resistance. In an example, an outer diameter and turn width of the inductor 214 may be selected to simulate an inductor model to determined an inductance value for a specific frequency. In an example, the inductor 214 may have an inductance value of about 231.9 pH at 12 MHz.

Figure 12:
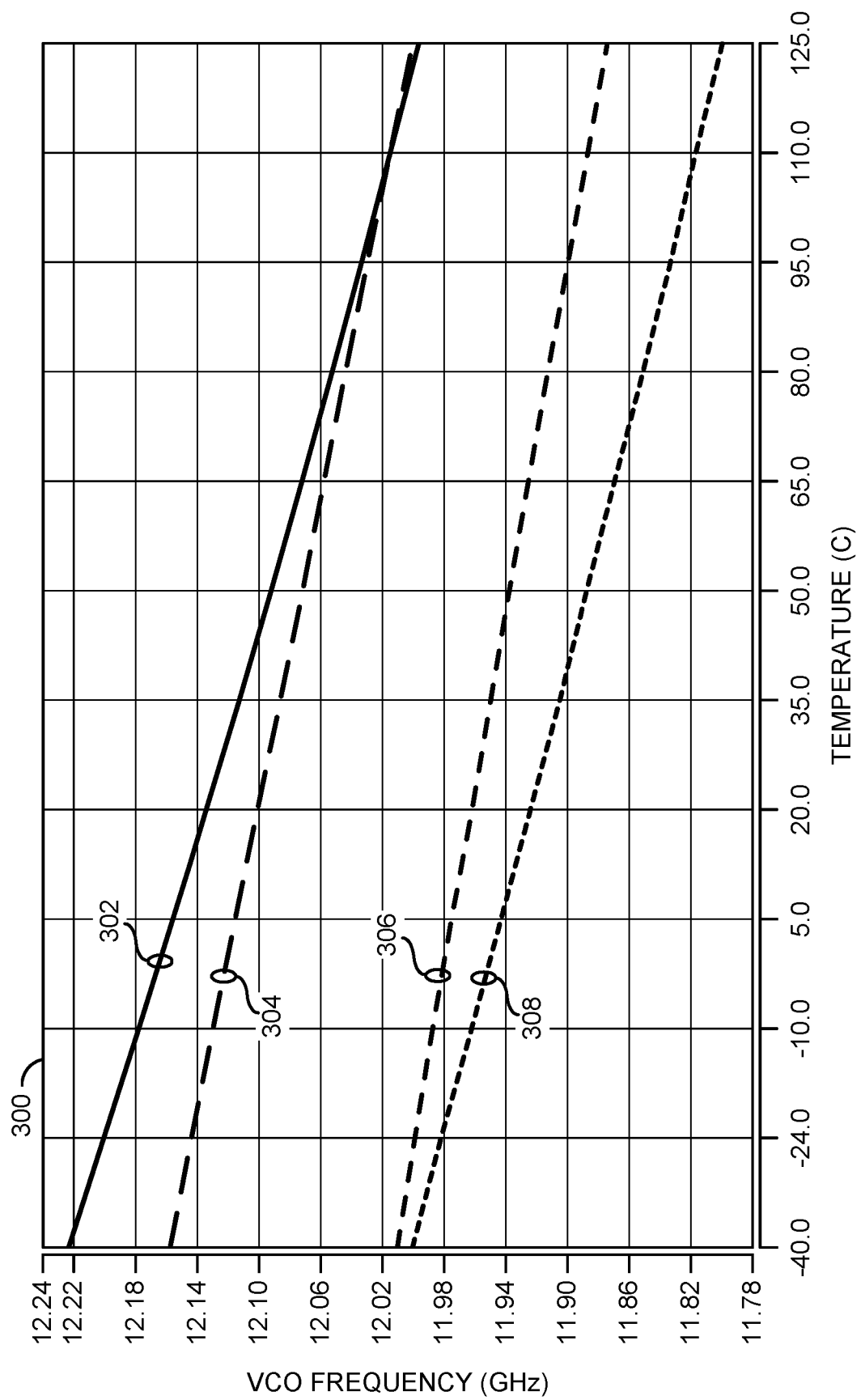
FIG. 12 is a diagram illustrating a comparison of frequency variation due to temperature between a reverse connected varactor circuit in accordance with an embodiment of the invention and a forward connected varactor circuit.

Referring to FIG. 12, a diagram of a graph 300 is shown illustrating a comparison of VCO frequency variation due to temperature between a reverse connected varactor circuit in accordance with an embodiment of the invention and a forward connected varactor circuit. A curve 302 illustrates a reverse connected varactor circuit calibrated for 12 GHz at 125° C. A curve 304 illustrates a forward connected varactor circuit calibrated for 12 GHz at 125° C. A curve 306 illustrates a forward connected varactor circuit calibrated for 12 GHz at −40° C. A curve 308 illustrates a reverse connected varactor circuit calibrated for 12 GHz at −40° C. The forward connected varactor circuit generally has less temperature variation, but the reverse connected varactor circuit generally has a larger tuning range.

Figure 13:
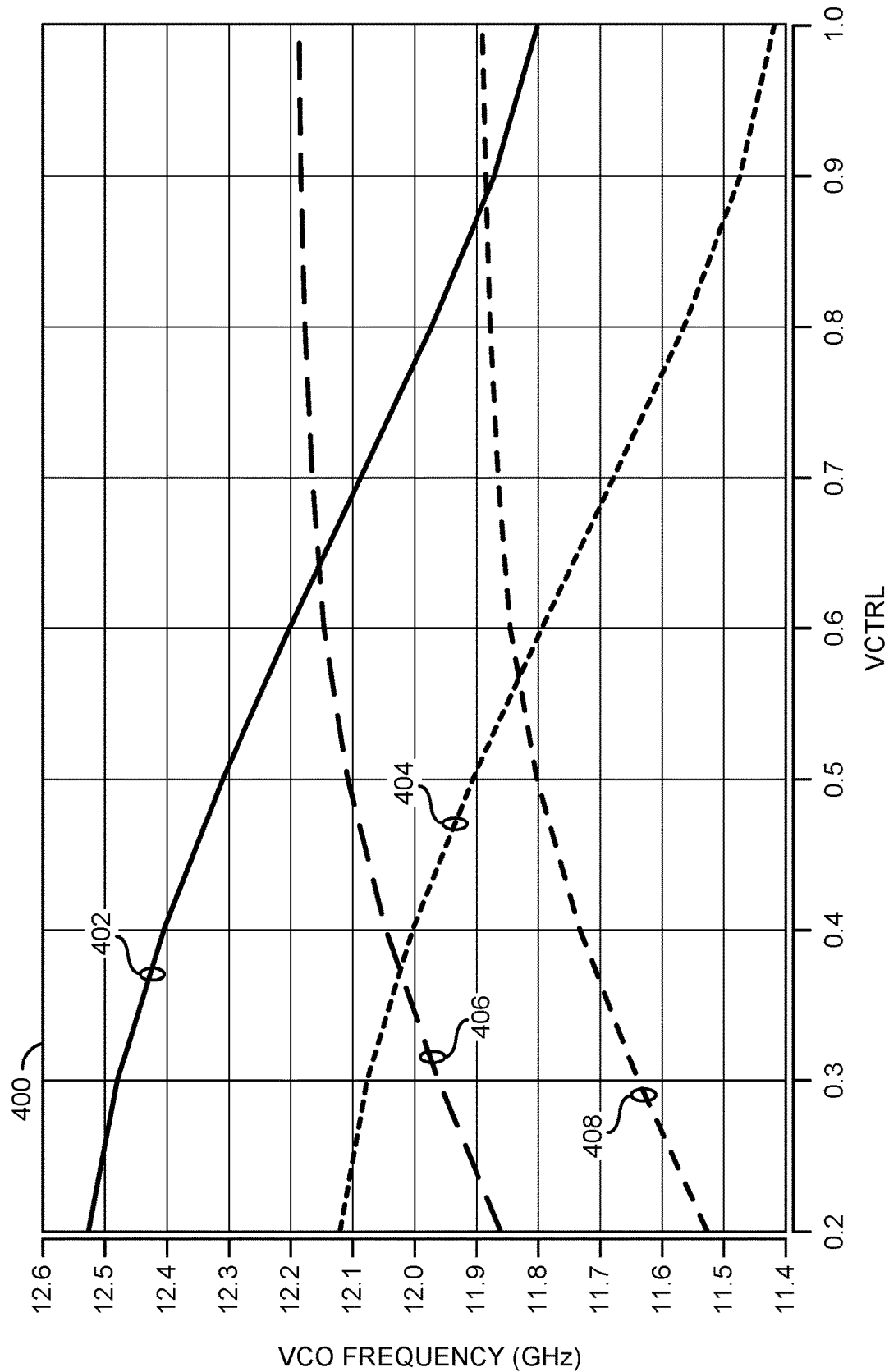
FIG. 13 is a diagram illustrating a comparison of frequency variation over a control voltage range between an inductive-capacitive (LC) voltage-controlled oscillator (VCO) circuit with a reverse connected varactor circuit in accordance with an embodiment of the invention and an inductive-capacitive (LC) voltage-controlled oscillator (VCO) circuit with a forward connected varactor circuit.

Referring to FIG. 13, a diagram of a graph 400 is shown illustrating a comparison of VCO frequency versus control voltage between an inductive-capacitive (LC) voltage-controlled oscillator (VCO) circuit with a reverse connected varactor circuit in accordance with an embodiment of the invention and an inductive-capacitive (LC) voltage-controlled oscillator (VCO) circuit with a forward connected varactor circuit. A curve 402 illustrates VCO frequency versus control voltage at −40° C. for a reverse connected varactor circuit with the signal CPCTRL<6:0> calibrated for 12 GHz at 125° C. A curve 404 illustrates a reverse connected varactor circuit calibrated for 12 GHz at −40° C. A curve 406 illustrates VCO frequency versus control voltage for a forward connected varactor circuit calibrated for 12 GHz at 125° C. A curve 408 illustrates VCO frequency versus control voltage for a forward connected varactor circuit calibrated for 12 GHz at −40° C. In the forward connected varactor circuit, frequency increases only slightly when the control voltage VCTRL is greater than 0.7V. With the reverse connected varactor circuit, a better range of the control voltage VCTRL may be achieved that covers three times the frequency range in temperature.

Figure 14:
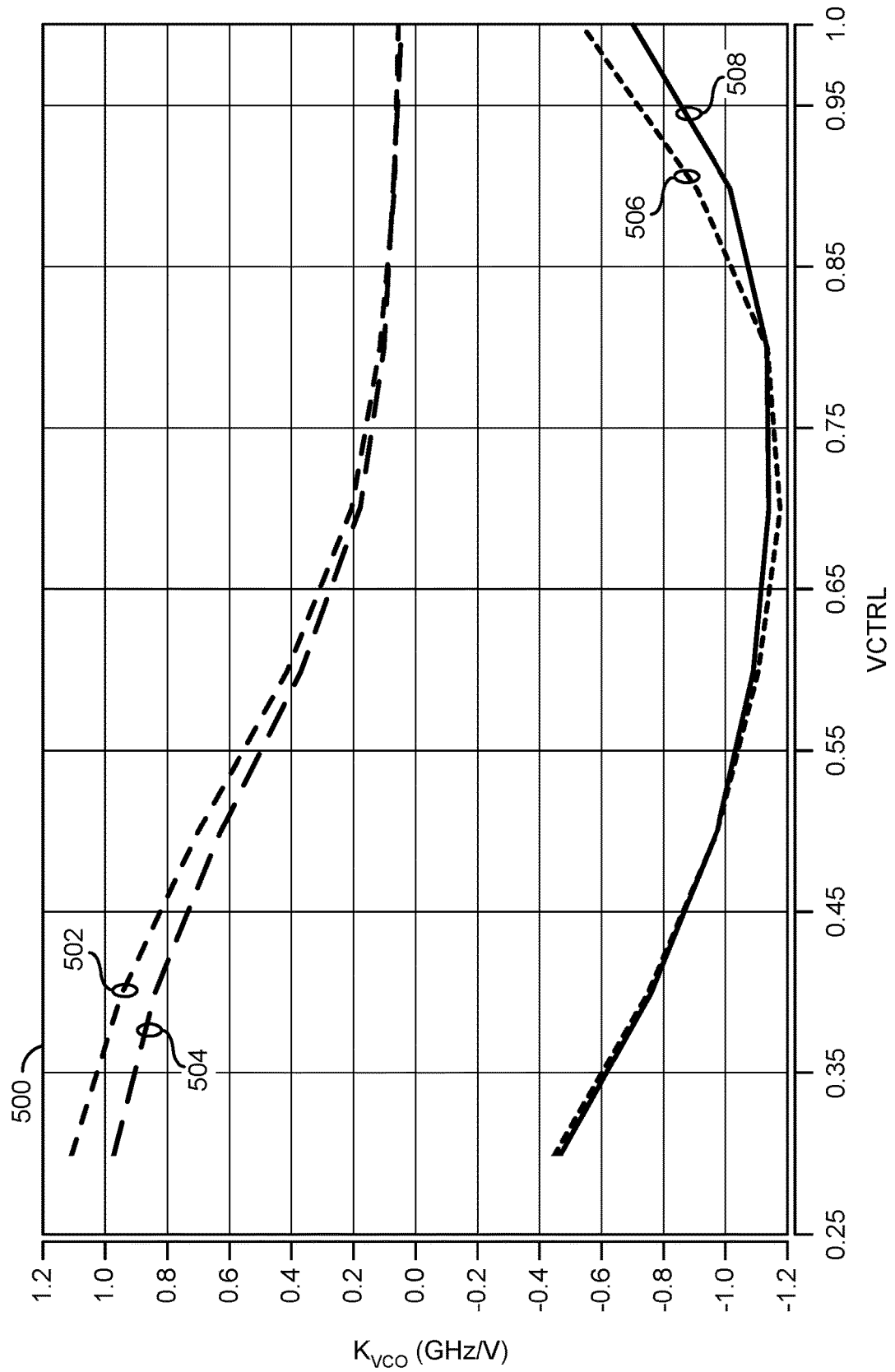
FIG. 14 is a diagram illustrating a comparison of VCO gain between an inductive-capacitive (LC) voltage-controlled oscillator (VCO) circuit with a reverse connected varactor circuit in accordance with an embodiment of the invention and an inductive-capacitive (LC) voltage-controlled oscillator (VCO) circuit with a forward connected varactor circuit.

Referring to FIG. 14, a diagram of a graph 500 is shown illustrating a comparison of VCO gain between an inductive-capacitive (LC) voltage-controlled oscillator (VCO) circuit with a reverse connected varactor circuit in accordance with an embodiment of the invention and an inductive-capacitive (LC) voltage-controlled oscillator (VCO) circuit with a forward connected varactor circuit. A curve 502 illustrates a forward connected varactor circuit calibrated for 12 GHz at −40° C. A curve 504 illustrates a forward connected varactor circuit calibrated for 12 GHz at 125° C. A curve 506 illustrates a reverse connected varactor circuit calibrated for 12 GHz at −40° C. A curve 508 illustrates a reverse connected varactor circuit calibrated for 12 GHz at 125° C. In the forward connected varactor circuit, frequency increases only slightly when the control voltage VCTRL is greater than 0.7V. With the reverse connected varactor circuit, $K_{VCO}$ is larger when the control voltage VCTRL is greater than 0.7V.

Referring to FIG. 15, a diagram 600 is shown illustrating capacitor bank C and Q parameters over a capacitor bank control input range. A graph 602 is shown illustrating capacitance values over the range of values of the signal CPCTRL<6:0>. A graph 604 is shown illustrating capacitance step size values over the range of values of the signal CPCTRL<6:0>. A graph 606 is shown illustrating Q-factor values over the range of values of the signal CPCTRL<6:0>. A curve 610 illustrates capacitance values at PVT corner SS, −40° C., 1.2V-5%. A curve 612 illustrates capacitance values at PVT corner TT, 55° C., 1.2V. A curve 614 illustrates capacitance values at PVT corner FF, 125° C., 1.2V+5%. A curve 620 illustrates capacitance step values at PVT corner FF, 125° C., 1.2V+5%. A curve 622 illustrates delta capacitance values at PVT corner TT, 55° C., 1.2V. A curve 624 illustrates delta capacitance values at PVT corner SS, −40° C., 1.2V-5%.

Figure 16:
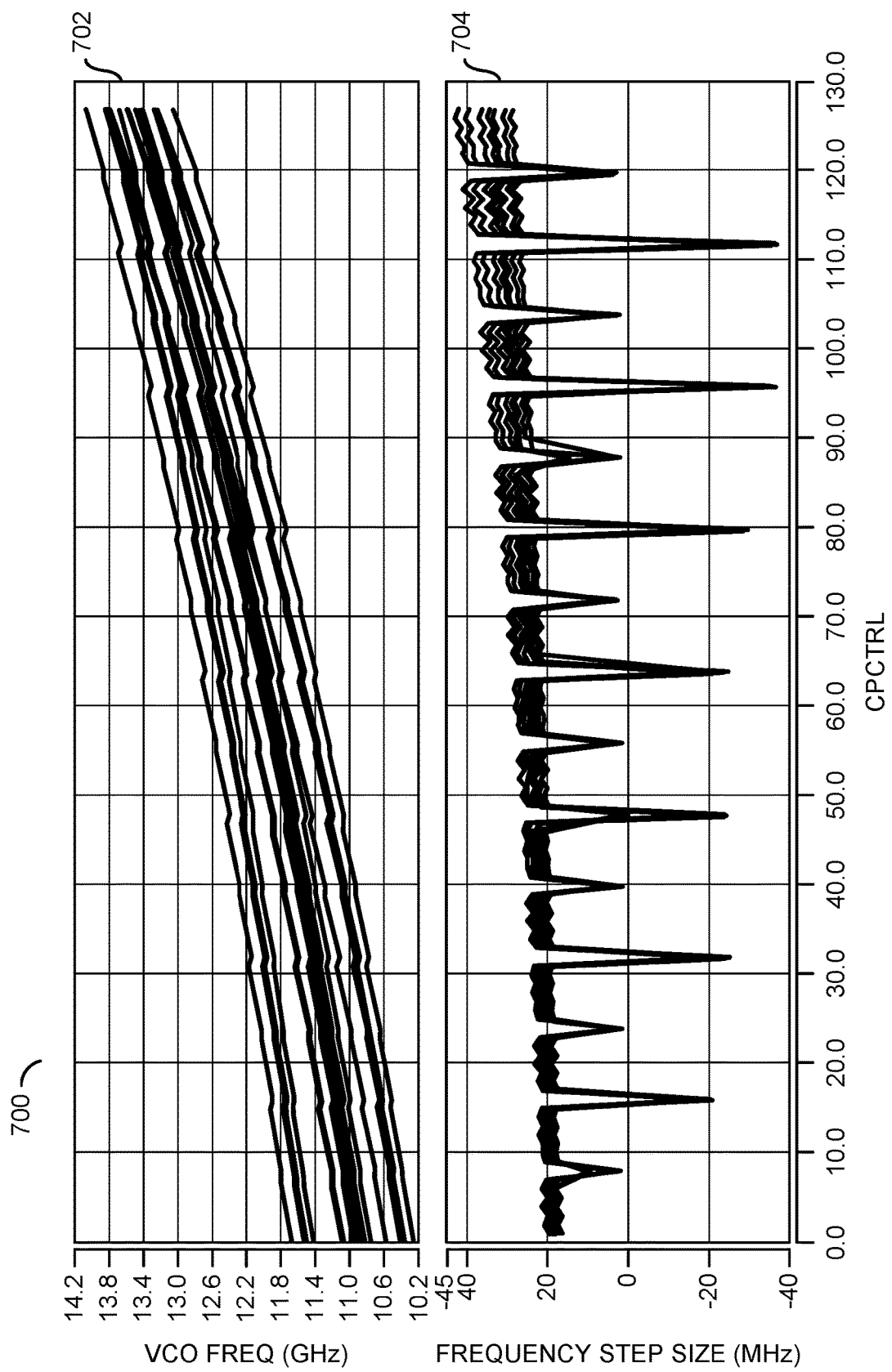
FIG. 16 is a diagram illustrating VCO frequency and frequency delta simulations over a capacitor bank control input range of an inductive-capacitive (LC) voltage-controlled oscillator (VCO) circuit in accordance with an embodiment of the invention.

Referring to FIG. 16, a diagram 700 is shown illustrating frequency and delta frequency of an inductive-capacitive (LC) voltage-controlled oscillator (VCO) circuit in accordance with an embodiment of the invention. A graph 702 is shown illustrating VCO frequency (GHz) over the range of values of the signal CPCTRL<6:0> for seventeen PVT corners. A graph 704 is shown illustrating frequency step size (MHz) over the range of values of the signal CPCTRL<6:0> for seventeen PVT corners. In general, VCO frequency and frequency step size are not monotonic to avoid frequency jumps (e.g., illustrated by the peaks in the graph 704). The signal VCTRL is generally close to half of the supply voltage VDD when the LCPLL 100 is locked due to the frequency step size being small (e.g., <45 MHz) and the tuning gain being about 1 GHz/V.

Figure 17:
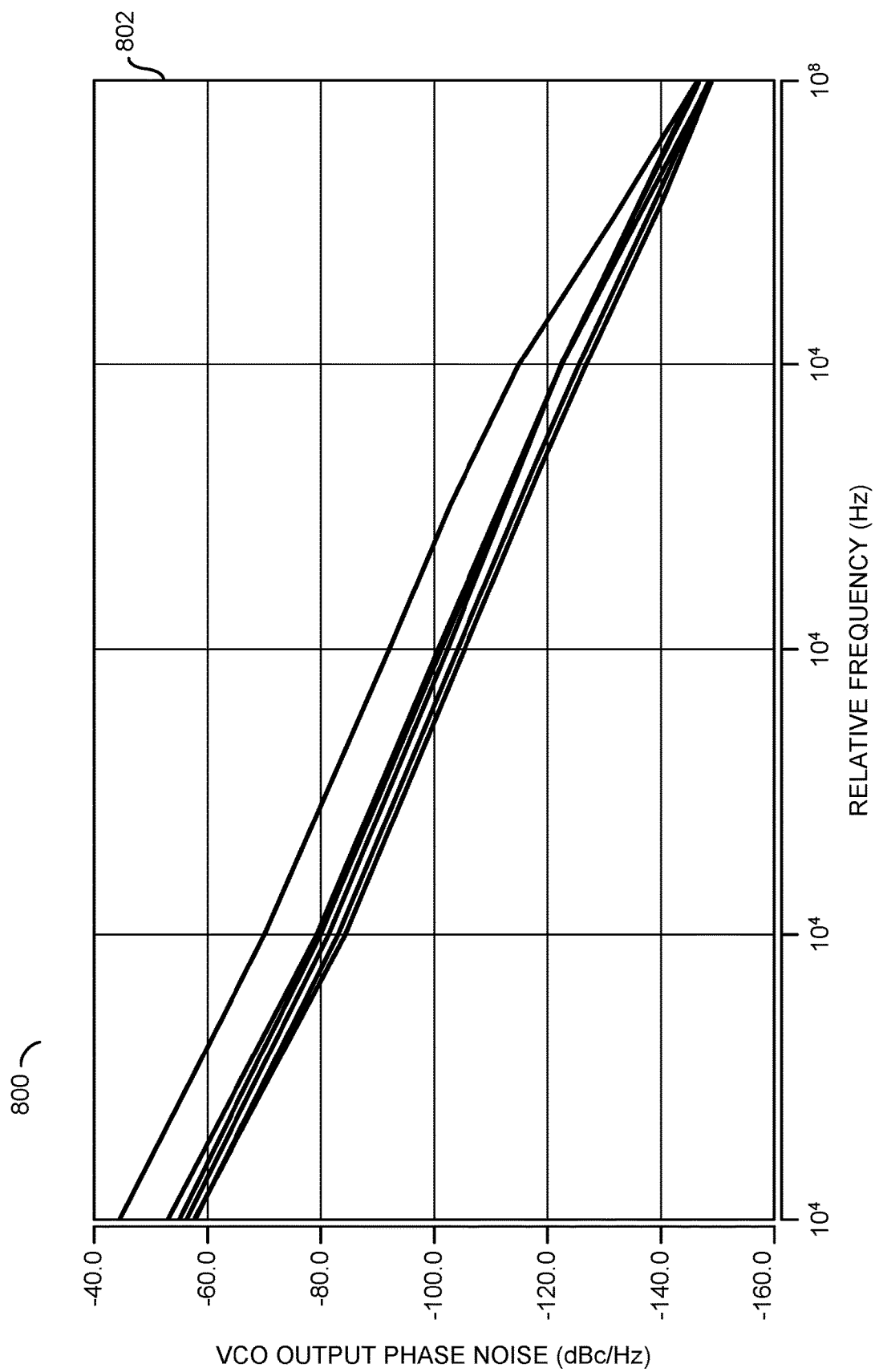
FIG. 17 is a diagram illustrating phase noise simulation of an inductive-capacitive (LC) voltage-controlled oscillator (VCO) circuit in accordance with an embodiment of the invention.

Referring to FIG. 17, a diagram 800 is shown illustrating phase noise of an inductive-capacitive (LC) voltage-controlled oscillator (VCO) circuit in accordance with an embodiment of the invention. A graph 802 is shown illustrating VCO differential output phase noise over 17 PVT corners. In various embodiments, phase noise of an inductive-capacitive (LC) voltage-controlled oscillator (VCO) circuit in accordance with an embodiment of the invention may be −100.8 dBc/Hz at 1 MHz offset at the typical/nominal (TT) process corner, with power consumption 5.79 mA. In an example, the LCVCO may increase gm by changing the setting of the signal GM<1:0> to improve phase noise.

Figure 18:
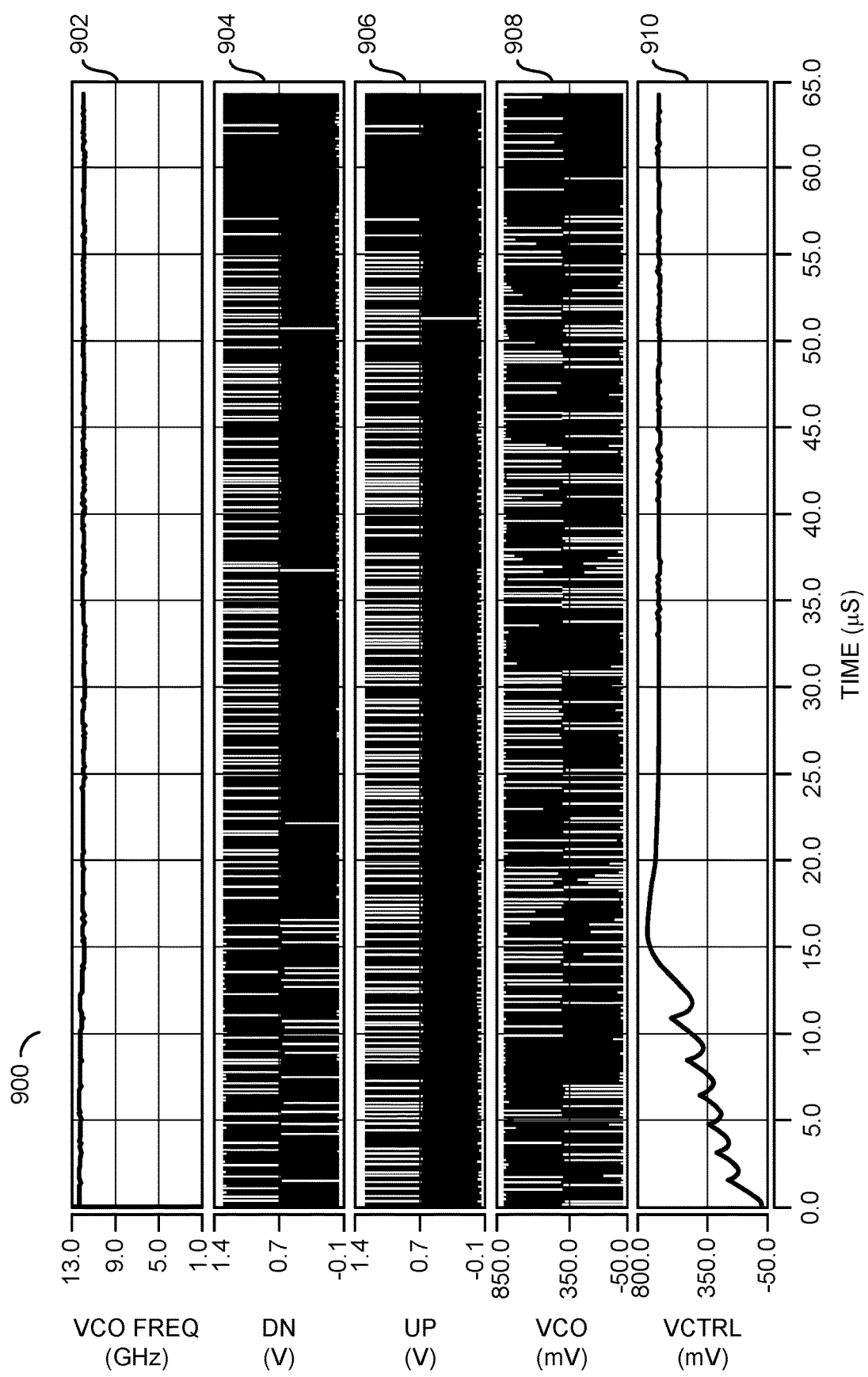
FIG. 18 is a diagram illustrating a simulation of an inductive-capacitive (LC) phase-locked loop (PLL) circuit in accordance with an embodiment of the invention.

Referring to FIG. 18, a diagram 900 is shown illustrating a simulation of an inductive-capacitive (LC) phase-locked loop (PLL) circuit in accordance with an embodiment of the invention. A graph 902 illustrates variation in the frequency $F_{VCO}$ of the output signal OUT during the startup period. A graph 904 illustrates a voltage level of the charge pump signal DN during a startup period. A graph 906 illustrates a voltage level of the charge pump signal UP during the startup period. A graph 908 illustrates a voltage level of the signal OUT. A graph 910 illustrates a voltage level of the signal VCTRL.

Figure 19:
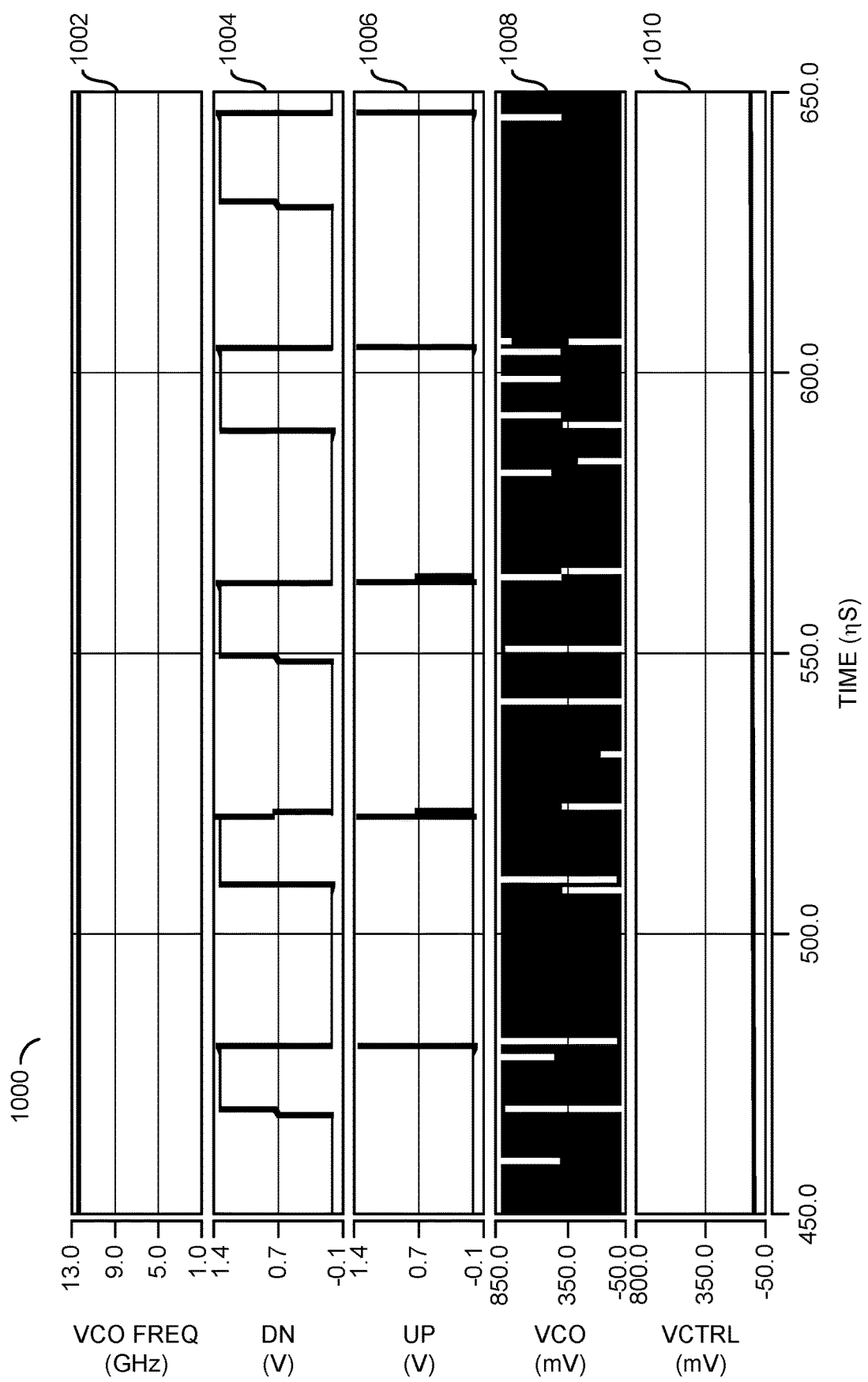
FIG. 19 is a diagram illustrating a simulation of an inductive-capacitive (LC) phase-locked loop (PLL) circuit in accordance with an embodiment of the invention.

Referring to FIG. 19, a diagram 1000 is shown illustrating a simulation of an inductive-capacitive (LC) phase-locked loop (PLL) circuit in accordance with an embodiment of the invention when a control voltage is approximately zero volts. A graph 1002 illustrates variation in the frequency $F_{VCO}$ of the output signal OUT. A graph 1004 illustrates a voltage level of the charge pump signal DN. A graph 1006 illustrates a voltage level of the charge pump signal UP. A graph 1008 illustrates a voltage level of the signal OUT. A graph 1010 illustrates a voltage level of the signal VCTRL. When voltage level of the signal VCTRL is approximately zero, the VCO frequency is highest. When the VCO frequency is highest, a pulse width of the signal DN is wider. When the pulse width of the signal DN is wider, the voltage level of the signal VCTRL increases due to the negative VCO gain ($-K_{VCO}$) of the LCVCO design in accordance with an embodiment of the invention.

Figure 20:
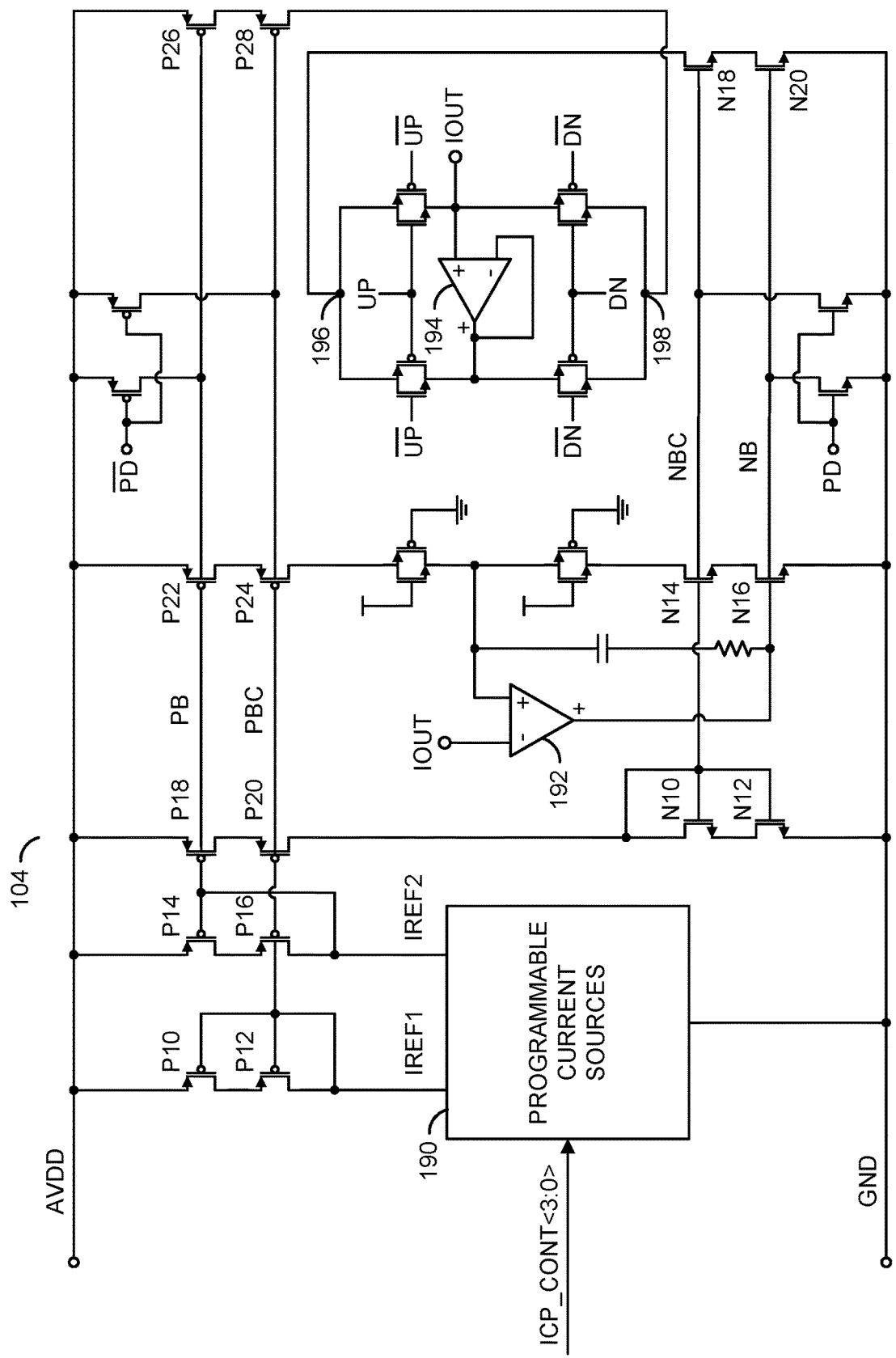
FIG. 20 is a diagram illustrating a charge pump circuit in accordance with an embodiment of the invention.

Referring to FIG. 20, a diagram is shown illustrating an example implementation of the charge pump circuit 104 in accordance with an embodiment of the invention. In an example, the charge pump 104 may have a first input that may receive the signal UP, a second input that may receive the signal DN, and a third input that may receive a signal (e.g., ICP_CTRL). In various embodiments, the signal ICP_CTRL may be implemented as a multi-bit digital control signal (e.g., ICP_CTRL<N:0>). In an example, the signal ICP_CTRL my be implemented as a 4-bit digital control signal (e.g., ICP_CTRL<3:0>). However, other numbers of bits may be implemented to meet design criteria of a particular implementation. The signals UP and DN may be used to control the charge pump 104 when the charge pump 104 is enabled.

The signal ICP_CTRL may be used to set reference currents of the charge pump 104. In an example, the charge pump 104 may comprise a plurality of PMOS transistors P10-P28, a plurality of NMOS transistors N10-N20, a reference current generating circuit 190, an operational amplifier (OPAMP) 192, and an OPAMP 194. In an example, the reference current generating circuit 190 may comprise a number of programmable current sources. In an example, the reference current generating circuit 190 may have a control input that may receive the signal ICP_CTRL, a first terminal that may present a first current signal (e.g., IREF1), a second terminal that may present a second current signal (e.g., IREF2), and a third terminal that may be connected to a circuit ground potential. In various embodiments, the reference current generating circuit 190 may be configured to generate the first current signal IREF1 and the second current signal IREF2 based on a value of the signal ICP_CTRL.

The PMOS transistor P10 and a PMOS transistor P12 may be configured to generate a first bias signal (e.g., PBC) in response to the current signals IREF1. A PMOS transistor P14 and a PMOS transistor P16 may be configured to generate a second bias signal (e.g., PB) in response to the current signals IREF2. The NMOS transistor N10 and an NMOS transistor N12 may be configured to generate a third bias signal (e.g., NBC). The OPAMP 192 may be configured to generate a fourth bias signal (e.g., NB) based on the signal IOUT. The bias signal PB may be presented to a gate terminal of the PMOS transistors P18, P22, and P26. The bias signal PBC may be presented to a gate terminal of the PMOS transistors P20, P24, and P28. The bias signal NBC may be presented to a gate terminal of the NMOS transistors N14 and N18. The bias signal NB may be presented to a gate terminal of the NMOS transistors N16 and N20.

The PMOS transistors P26 and P28 may configured as a first output current source. The NMOS transistors N18 and N20 may configured as a second output current source. Connection of an output of the first output current source to the output terminal of the charge pump 104 may be controlled by the signal UP. Connection of an output of the second output current source to the output terminal of the charge pump 104 may be controlled by the signal DN. In various embodiments, up and down currents of the charge pump 104 may be swapped, relative to typical current pumps, to provide for a negative tuning gain (e.g., $-K_{VCO}$). In an example, the first output current source may be configured to dump current into an integrating capacitor of the loop filter 106 in response to the signal DN and the second output current source may be configured to remove (sink) charge from the integrating capacitor of the loop filter 106 in response to the signal UP. In an example, the charge pump circuit 104 may be further configured to be placed in a zero power consumption state in response to a powerdown signal (e.g., PD) being asserted.

Figure 21:
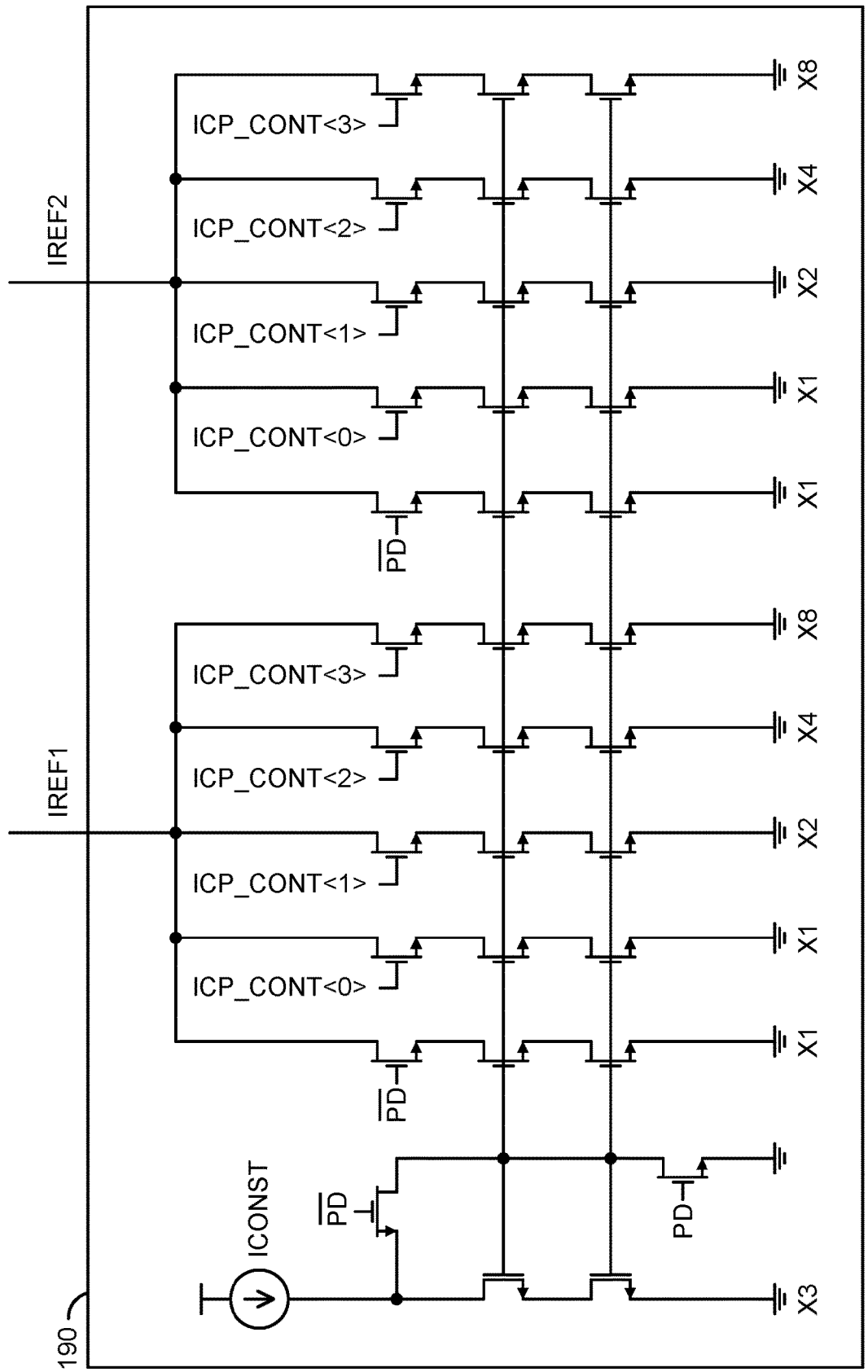
FIG. 21 is a diagram illustrating a programmable current source circuit of FIG. 20.

Referring to FIG. 21, a diagram is shown illustrating an example implementation of the reference current generating circuit 190 of FIG. 20. In an example, a constant current (e.g., ICONST) may be used to bias a first plurality of binary weighted current sources and a second plurality of binary weighted current sources. The first plurality of binary weighted current sources may be configured to generate the reference current IREF1 in response to the constant current ICONST and the digital control signal ICP_CTRL<3:0>.

The second plurality of binary weighted current sources may be configured to generate the reference current IREF2 in response to the constant current ICONST and the digital control signal ICP_CTRL<3:0>. In an example, the reference current generating circuit 190 may be further configured to be placed in a zero power consumption state in response to a powerdown signal (e.g., PD) being asserted.

In various embodiments, an LCVCO design in accordance with an embodiment of the invention may use thick oxide varactors and reverse varactor connections to have a wider frequency range (larger Kvco). Thin oxide switches may be used for capacitor banks to reduce switch resistance and have a better Q-factor (internal supply 0.8V). An LDO regulator may be used to provide the voltage supply of the gm core and switches, resulting in high gm, low switch resistance, and good supply rejection. Minimum area, width, and length, and higher metal layers (e.g., metal layers 10 to 12, D10-D12 in Samsung 4 nm process technology) may be used for capacitors, resulting in low metal resistance and high Q. A novel capacitor bank layout method may also be used to have better Q in 4 nm process. A novel MOS and varactor layout method may be employed to reduce gate resistance and achieve less coupling. In PLLs utilizing an LCVCO design in accordance with an embodiment of the invention, up and down currents in the charge pump may be swapped for a negative tuning gain ($-K_{VCO}$).

In an example, the new layout technique shortens the routing of the VCO outputs, and lowers the parasitic inductance and resistance of the VCO routing, which prevents the reduction of the quality factor of the LC tank due to long routing. When implementing the LCVCO with Samsung 4 nm process technology, the new layout technique generally includes using metal 1-5 layers only in short connections for high speed circuits, using metal 6 layer and above on critical low resistance and long routings for high speed circuits, and implementing capacitor banks with higher metal layers (e.g., metal 10-12 layers) and minimum area with minimum width and length as unit capacitor to maximize Q. The transistors P0, P1, N0, and N1, and the varactors Q0, Q1, Q2, Q3, Q4 gate/drain metal connections may be orthogonal to reduce metal resistance. Coupling between two signals may be reduce in half by implemented Source-Drain-Drain-Source routing instead of Source-Drain-Source-Drain routing. Metal may be overlapped as much as possible to minimize metal resistance. Wider even number metal layers may be used to connect horizontally and wider odd number metal layers may be used to connect vertically between two vertical natural capacitors (vncaps) to reduce metal resistance.

The functions performed by the diagrams of FIGS. 1-21 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n"

may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
a cross-coupled differential amplifier comprising a first output terminal and a second output terminal;
an inductive-capacitive (LC) tank coupled in a feedback path of said cross-coupled differential amplifier between said first output terminal and said second output terminal, said LC tank comprising (i) an inductance provided by an inductor, (ii) a first capacitance provided by a parallel coupled varactor circuit, (iii) a second capacitance provided by a parallel coupled first switched-capacitor bank, and (iv) a third capacitance provided by a parallel coupled second switched-capacitor bank; and
a low-noise voltage supply configured to provide a supply voltage of said cross-coupled differential amplifier, wherein
said parallel coupled varactor circuit comprises a first thick oxide varactor and a second thick oxide varactor, a first drain/source terminal of said first thick oxide varactor is connected to said first output terminal, a second drain/source terminal of said second thick oxide varactor is connected to said second output terminal, and a first gate terminal of said first thick oxide varactor and a second gate terminal of said second thick oxide varactor are connected together to receive a control voltage signal presented to said parallel coupled varactor circuit, and
said parallel coupled first switched-capacitor bank and said parallel coupled second switched-capacitor bank comprise thin oxide switches.

2. The apparatus according to claim 1, wherein said low-noise voltage supply comprises a low drop out regulator.

3. The apparatus according to claim 1, wherein said parallel coupled first switched-capacitor bank provides coarse tuning of a capacitance value of said LC tank.

4. The apparatus according to claim 3, wherein said parallel coupled second switched-capacitor bank provides fine tuning of the capacitance value of said LC tank.

5. The apparatus according to claim 1, wherein:
said parallel coupled varactor circuit further comprises a third thick oxide varactor, a fourth thick oxide varactor, and a switch circuit;
a third drain/source terminal of said third thick oxide varactor is connected to said first output terminal;
a fourth drain/source terminal of said fourth thick oxide varactor is connected to said second output terminal;
a third gate terminal of said third thick oxide varactor and a fourth gate terminal of said fourth thick oxide varactor are connected to a common terminal of said switch circuit;
a first input terminal of said switch circuit is connected to receive said control voltage signal presented to said parallel coupled varactor circuit;
a second input terminal of said switch circuit is connected to a circuit ground potential;
a control input terminal of said switch circuit is connected to receive a second control signal presented to said parallel coupled varactor circuit; and
an output frequency of said apparatus is controlled in response to said control voltage signal and said second control signal presented to said parallel coupled varactor circuit.

6. The apparatus according to claim 5, further comprising a loop filter configured to generate said control voltage signal in response to a feedback loop of said apparatus.

7. The apparatus according to claim 6, wherein said feedback loop of said apparatus comprises:
a phase frequency detector configured to generate a first charge pump control signal and a second charge pump control signal in response to a difference between a reference signal and an output signal of said cross-coupled differential amplifier; and
a charge pump configured to increase or decrease an output charge of the charge pump based on the first charge pump control signal and the second charge pump control signal, wherein the loop filter provides the control voltage signal based on the output charge of the charge pump.

8. The apparatus according to claim 7, wherein said charge pump is configured for a negative frequency gain.

9. The apparatus according to claim 7, further comprising a counter configured to divide an oscillation rate of the output signal of said cross-coupled differential amplifier by a predefined oscillation value.

10. The apparatus according to claim 9, wherein said counter, said charge pump, said phase frequency detector, said loop filter, said cross-coupled differential amplifier, and said LC tank are arranged to implement an inductive-capacitive phase-locked loop.

11. The apparatus according to claim 1, wherein the cross-coupled differential amplifier, the parallel coupled varactor circuit, the parallel coupled first switched-capacitor bank, and the parallel coupled second switched-capacitor bank are instantiated on an integrated circuit substrate with a common centroid layout arrangement.

12. A method of implementing an inductive-capacitive phase-locked loop (LCPLL) comprising:
coupling an inductive-capacitive (LC) tank in a feedback path between a first output terminal and a second output terminal of a cross-coupled differential amplifier, wherein
said LC tank comprises (i) an inductance provided by an inductor, (ii) a first capacitance provided by a parallel coupled varactor circuit, (iii) a second capacitance provided by a parallel coupled first switched-capacitor bank comprising thin oxide switches, and (iv) a third capacitance provided by a parallel coupled second switched-capacitor bank comprising thin oxide switches, and
the parallel coupled varactor circuit comprises a first thick oxide varactor and a second thick oxide varactor, a first drain/source terminal of the first thick oxide varactor is connected to the first output terminal of the cross-coupled differential amplifier, a second drain/source terminal of the second thick oxide varactor is connected to the second output terminal of the cross-coupled differential amplifier, and a first gate terminal of the first thick oxide varactor and a second gate terminal of the second thick oxide varactor are connected together to receive a control voltage signal presented to the parallel coupled varactor circuit;

generating a first supply voltage to power the parallel coupled varactor circuit; and generating a second supply voltage to power the cross-coupled differential amplifier, the parallel coupled first switched-capacitor bank, and the parallel coupled second switched-capacitor bank, wherein the second supply voltage is generated by a low-noise voltage supply in response to the first supply voltage.

13. The method according to claim 12, wherein said low-noise voltage supply comprises a low drop out regulator.

14. The method according to claim 12, further comprising setting a coarse tuning step of a capacitance value of said LC tank with said parallel coupled first switched-capacitor bank.

15. The method according to claim 14, further comprising setting a fine tuning step of the capacitance value of said LC tank with said parallel coupled second switched-capacitor bank.

16. The method according to claim 12, further comprising controlling an output frequency of said inductive-capacitive phase-locked loop in response to Hall the control voltage signal presented to said parallel coupled varactor circuit.

17. The method according to claim 16, further comprising generating said control voltage signal with a loop filter in response to a feedback loop of said inductive-capacitive phase-locked loop.

18. The method according to claim 17, wherein said feedback loop comprises:

a phase frequency detector configured to generate a first charge pump control signal and a second charge pump control signal in response to a difference between a reference signal and an output signal of said cross-coupled differential amplifier; and a charge pump configured to increase or decrease an output charge of the charge pump based on the first charge pump control signal and the second charge pump control signal, wherein the loop filter provides the control voltage signal based on the output charge of the charge pump.

19. The method according to claim 18, wherein said charge pump is configured for a negative frequency gain.

20. The method according to claim 12, further comprising instantiating the cross-coupled differential amplifier, the parallel coupled varactor circuit, the parallel coupled first switched-capacitor bank, and the parallel coupled second switched-capacitor bank on an integrated circuit substrate with a common centroid layout arrangement.

* * * * *